United States Patent
Tailor

(10) Patent No.: US 11,855,139 B2
(45) Date of Patent: Dec. 26, 2023

(54) EXTENDED DRAIN FIELD EFFECT TRANSISTOR WITH TRENCH GATE(S) AND METHOD

(71) Applicant: GlobalFoundries U.S. Inc., Malta, NY (US)

(72) Inventor: Ketankumar Harishbhai Tailor, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 11 days.

(21) Appl. No.: 17/571,611

(22) Filed: Jan. 10, 2022

(65) Prior Publication Data
US 2023/0223437 A1      Jul. 13, 2023

(51) Int. Cl.
*H01L 29/78*     (2006.01)
*H01L 29/06*     (2006.01)
*H01L 29/66*     (2006.01)
*H01L 29/423*    (2006.01)

(52) U.S. Cl.
CPC ...... *H01L 29/0653* (2013.01); *H01L 29/4236* (2013.01); *H01L 29/66704* (2013.01); *H01L 29/7825* (2013.01); *H01L 29/7835* (2013.01)

(58) Field of Classification Search
CPC ......... H01L 29/06; H01L 29/66; H01L 29/78; H01L 29/423; H01L 29/0653; H01L 29/4236; H01L 29/7825; H01L 29/7835; H01L 29/66704; H01L 29/40; H01L 29/404; H01L 29/407; H01L 29/42368;
(Continued)

(56) References Cited

U.S. PATENT DOCUMENTS

| 6,710,403 | B2 | 3/2004  | Sapp           |
| 7,576,388 | B1 | 8/2009  | Wilson et al.  |
| 7,812,393 | B2 | 10/2010 | Williams et al.|

(Continued)

OTHER PUBLICATIONS

Wang et. al., "A Novel Orthogonal Gate EDMOS Transistor With Improved dv/dt Capability and Figure of Merit (FOM)," IEEE Electron Device Letters, vol. 29, Issue 12, 2008, pp. 1-4.
(Continued)

*Primary Examiner* — Chuong A Luu
(74) *Attorney, Agent, or Firm* — Anthony Canale; Hoffman Warnick LLC

(57) ABSTRACT

Disclosed are a semiconductor structure and method of forming the structure. The semiconductor structure includes an extended drain metal oxide semiconductor field effect transistor (EDMOSFET). The EDMOSFET includes, in the semiconductor layer, a body well, which has a source region therein, and a drain drift well, which abuts the body well and has a drain region therein. A trench gate structure is within the drain drift well positioned laterally between the body-drain drift junction and an internal shallow trench isolation (STI) region and the internal STI region is between the trench gate structure and the drain region. A primary gate structure is on the top surface of the semiconductor layer traversing the body-drain drift junction and optionally extending over the trench gate structure. Gate dielectric material physically separates gate conductor materials of the primary and trench gate structures. Optionally, the EDMOSFET includes more than one trench gate structure.

20 Claims, 30 Drawing Sheets

(58) Field of Classification Search
CPC ......... H01L 29/66659; H01L 29/66689; H01L 29/7843; H01L 29/665
USPC ....................................................... 257/330
See application file for complete search history.

(56) References Cited

U.S. PATENT DOCUMENTS

| | | |
|---|---|---|
| 7,888,732 B2 | 2/2011 | Denison et al. |
| 8,198,677 B2 | 6/2012 | Wilson et al. |
| 8,293,614 B2 | 10/2012 | Chu et al. |
| 10,141,440 B2 | 11/2018 | Kosier et al. |
| 2003/0116796 A1* | 6/2003 | King ..................... H01L 29/945 257/301 |
| 2013/0153999 A1 | 6/2013 | Zhang et al. |
| 2022/0045189 A1* | 2/2022 | Moore ................ H01L 29/0696 |

OTHER PUBLICATIONS

Tailor et al, "On the Breakdown Physics of Trench-Gate Drain Extended NMOS," IEEE Conference on Electron Devices and Solid-State Circuits (IEEE EDSSC), 2015, pp. 804-807.

\* cited by examiner

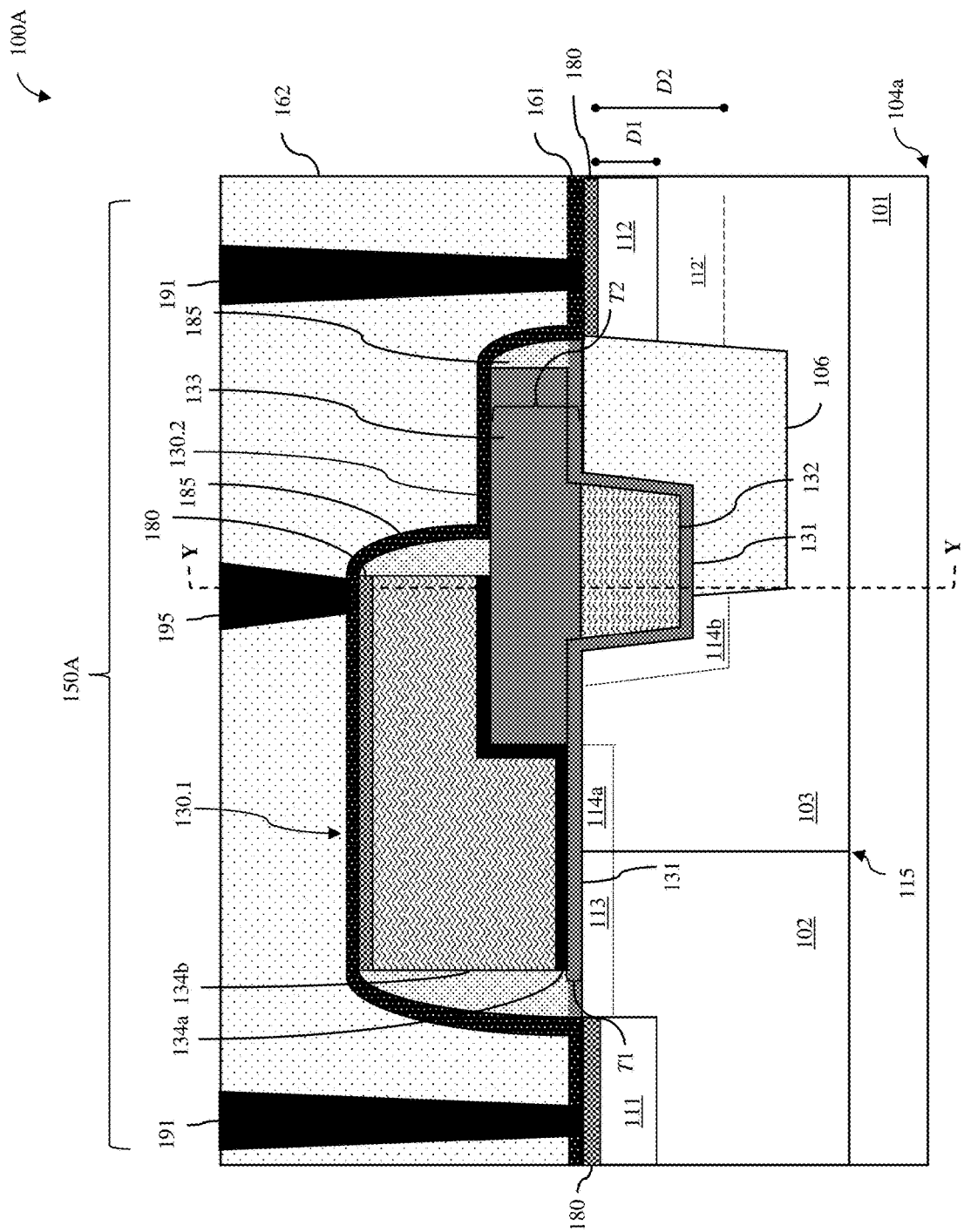
FIG. 1A(1)

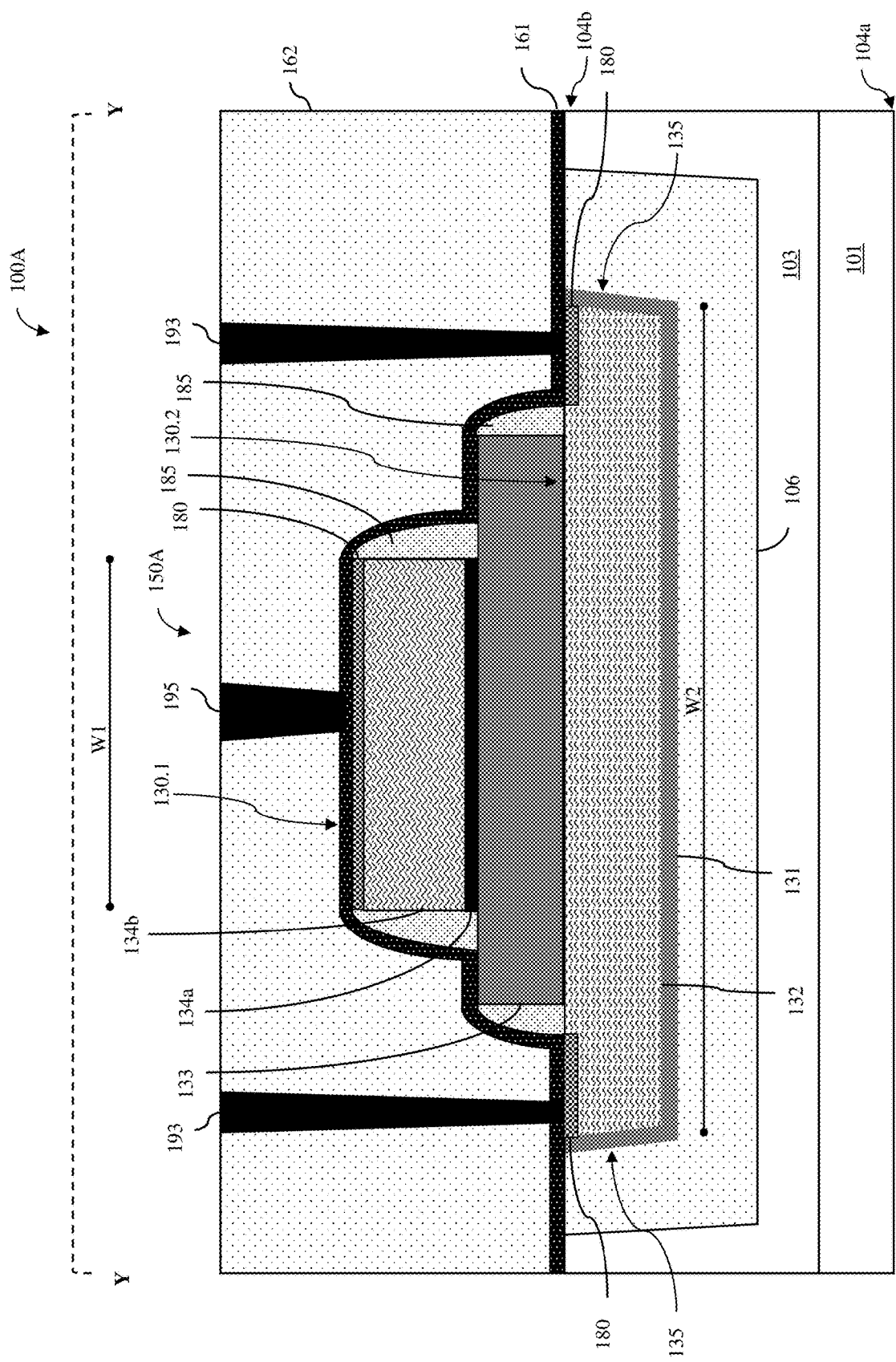
FIG. 1A(2)

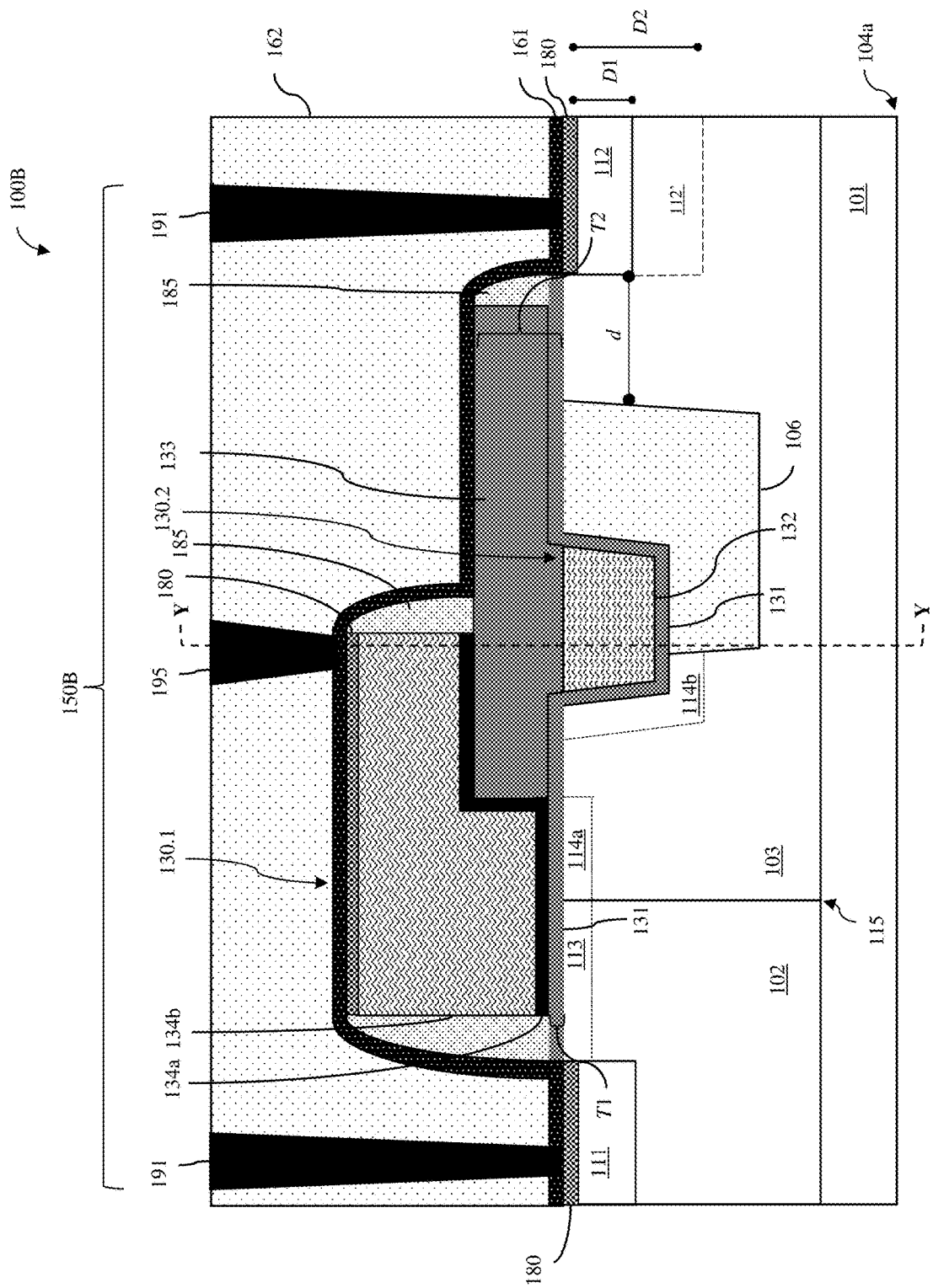
FIG. 1B(1)

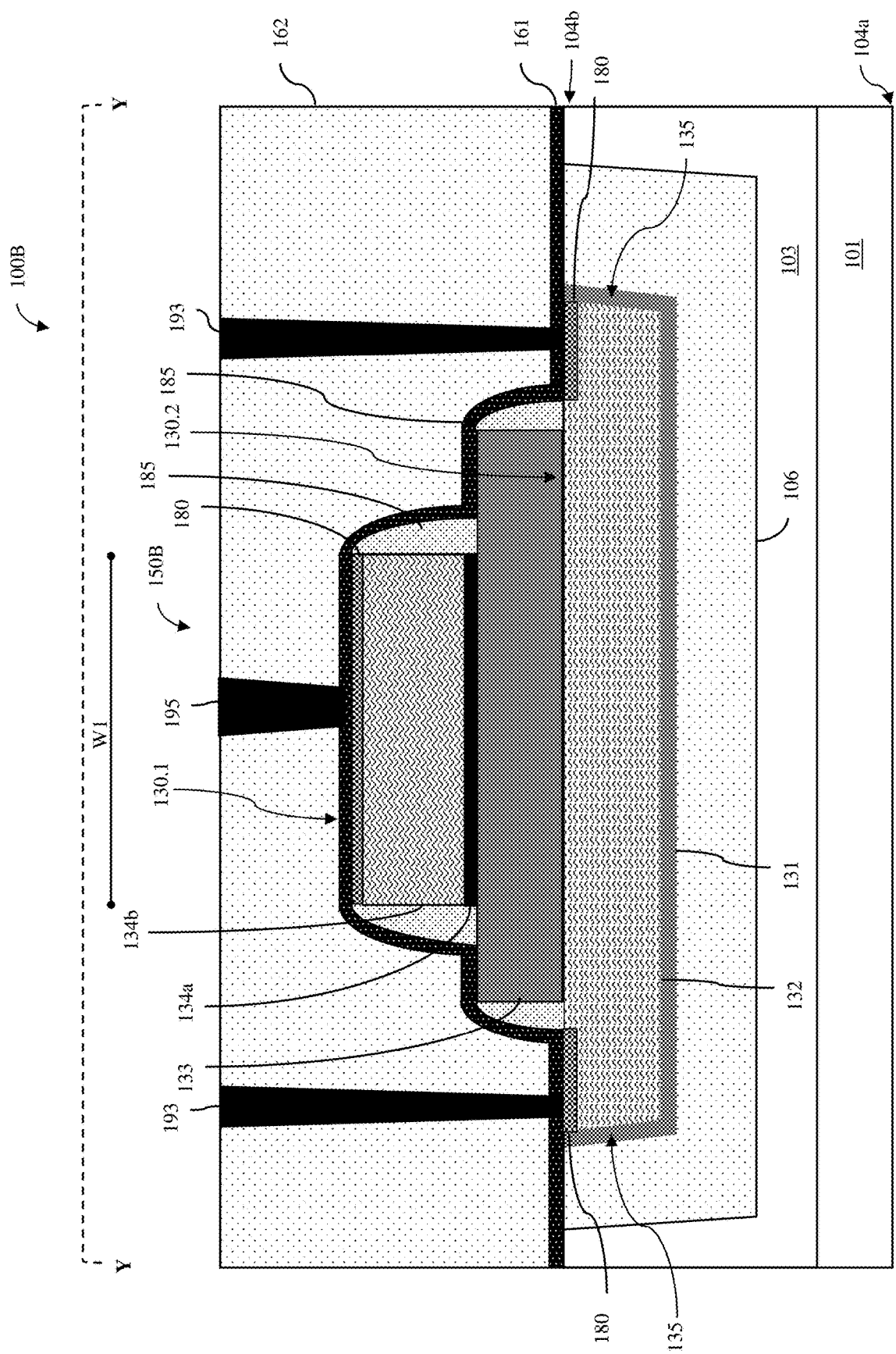
FIG. 1B(2)

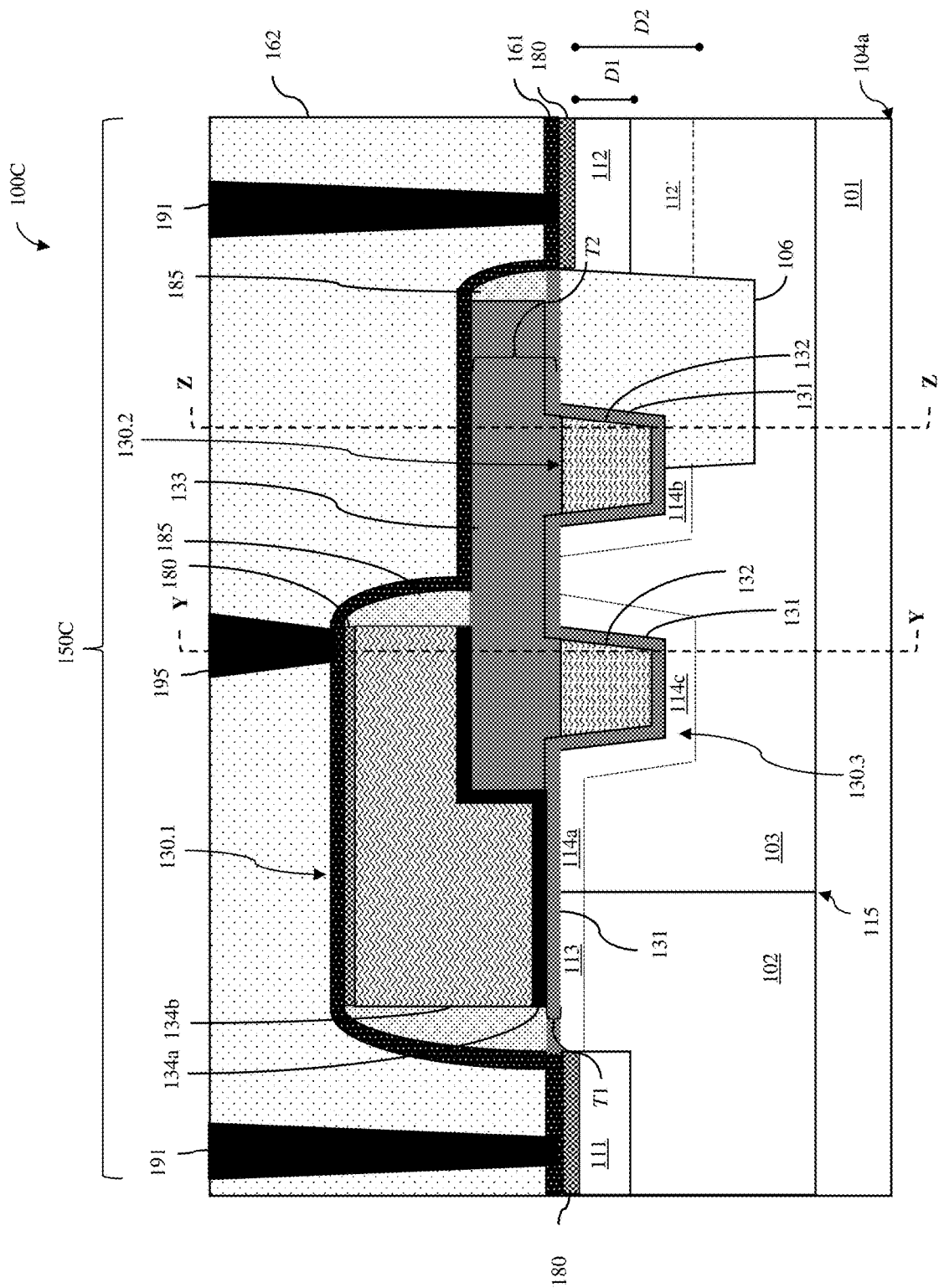
FIG. 1C(1)

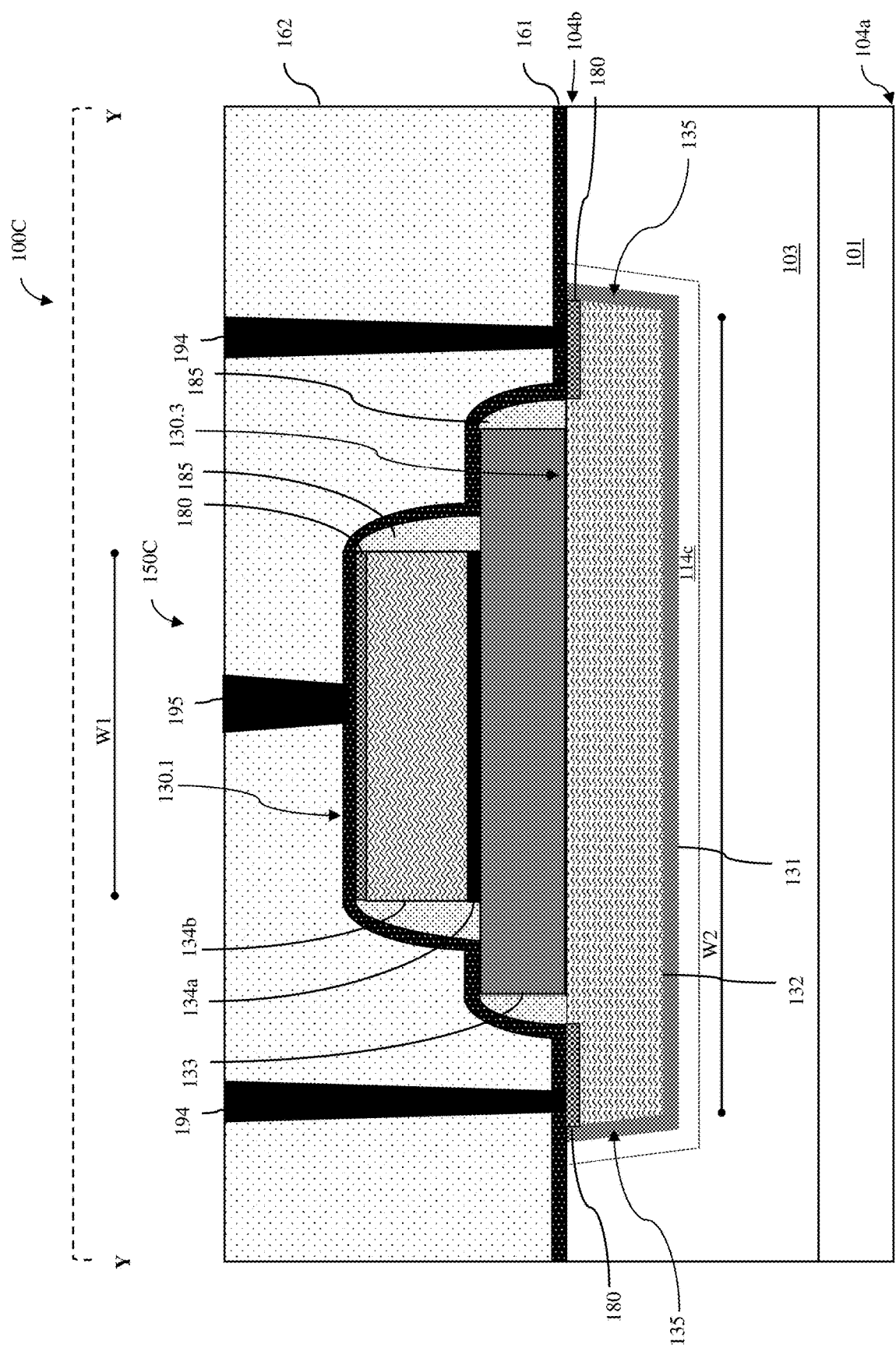
FIG. 1C(2)

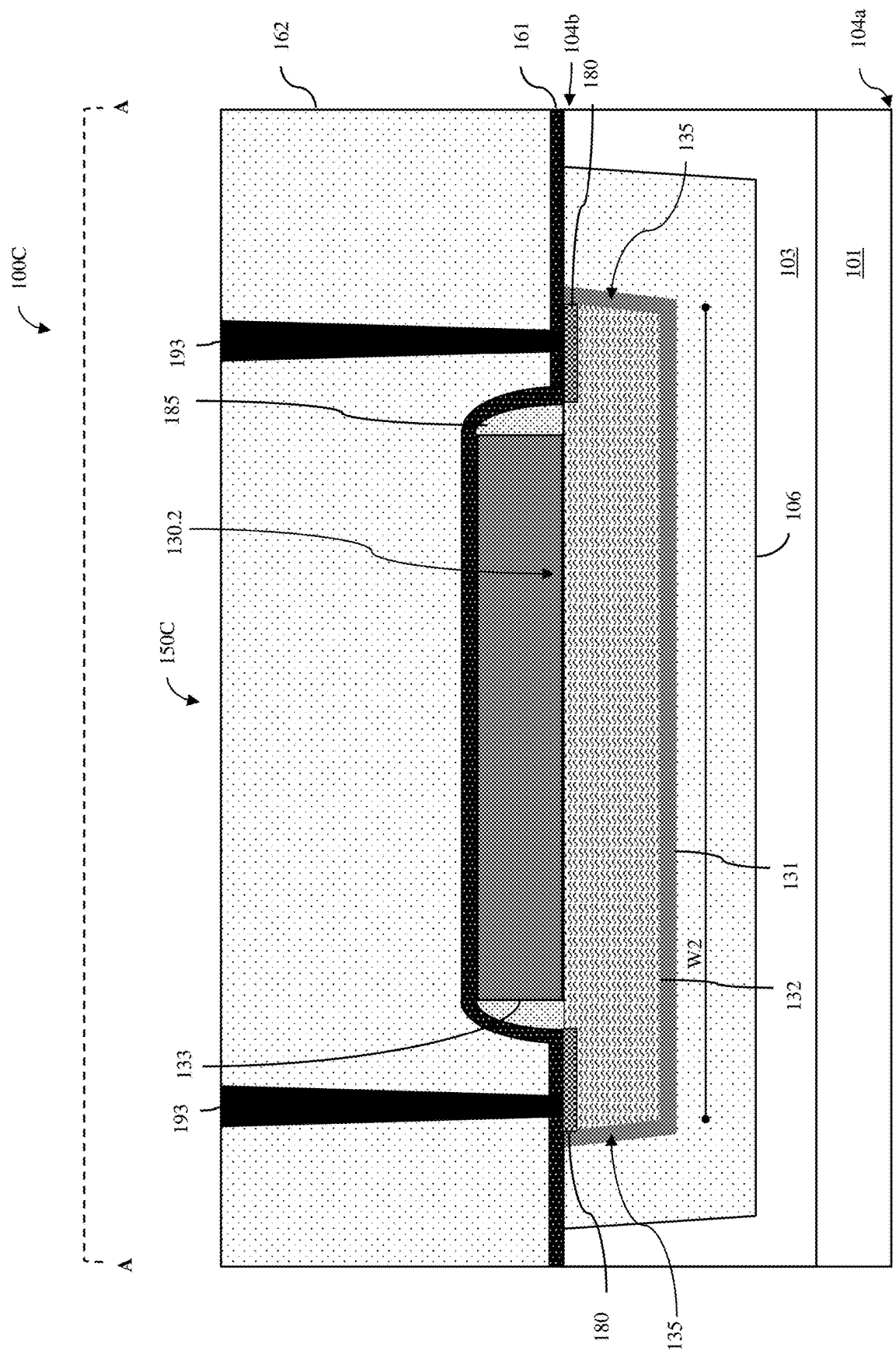
FIG. 1C(3)

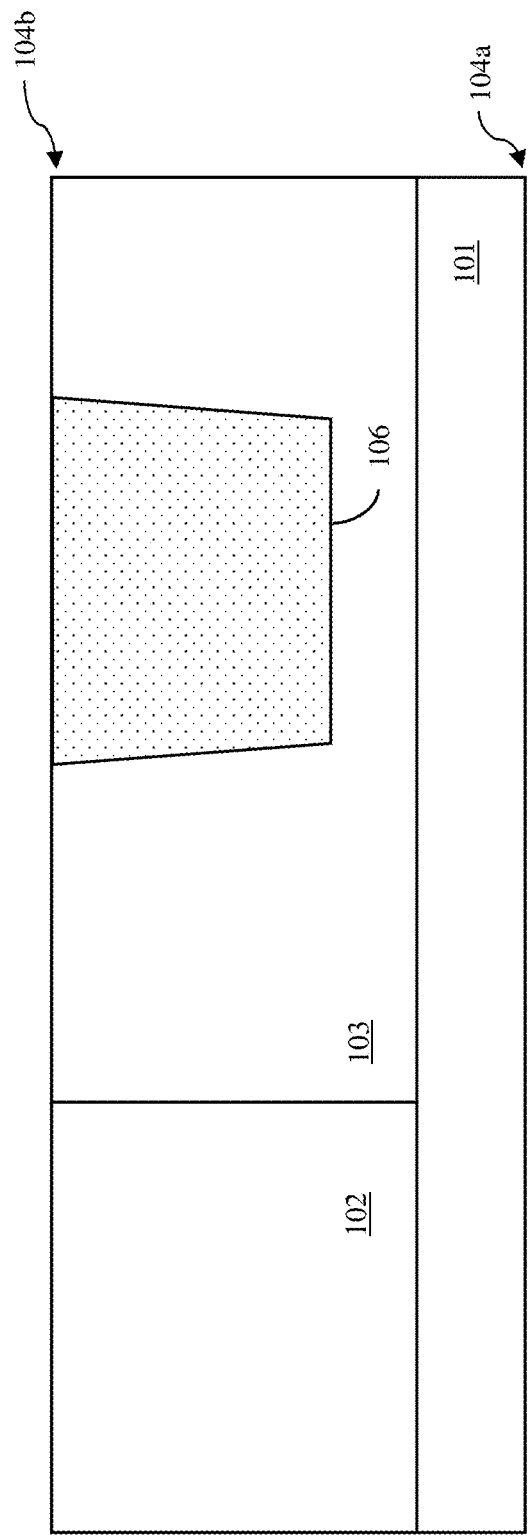

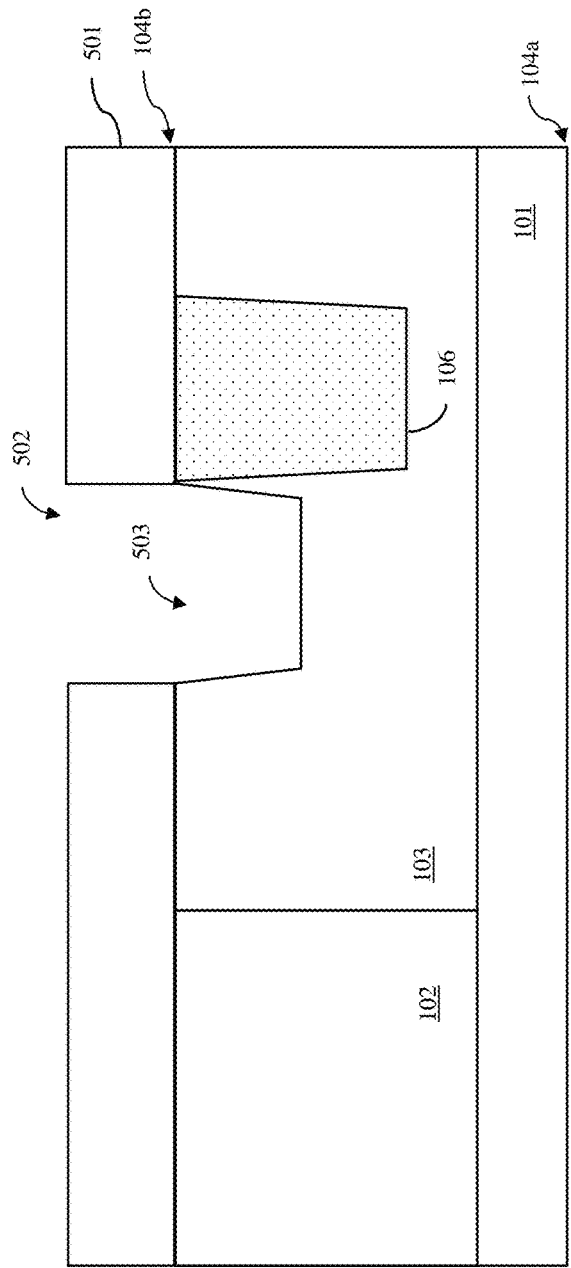
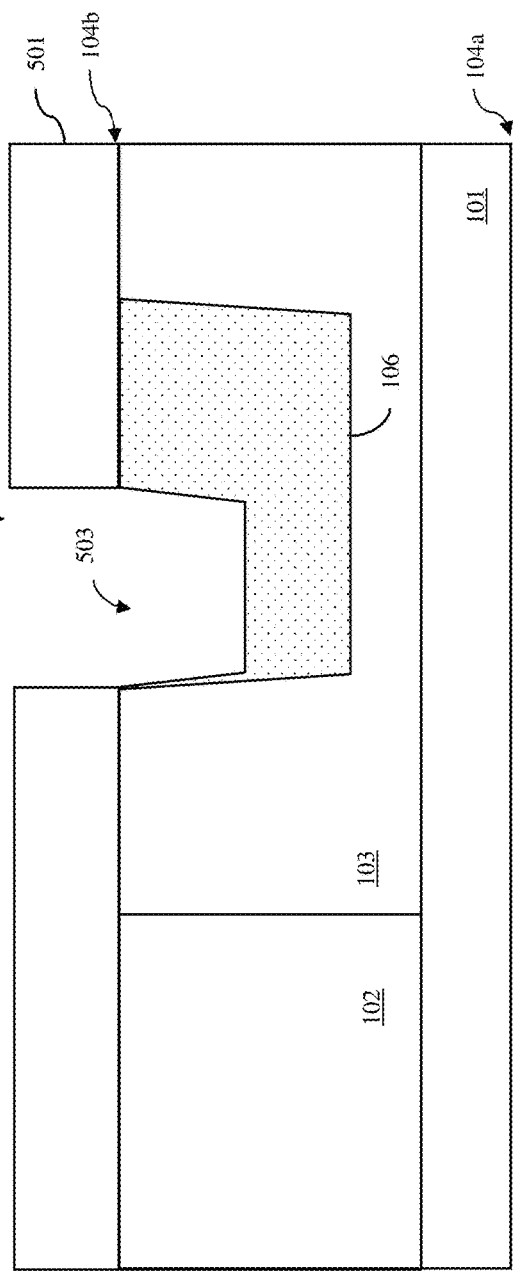

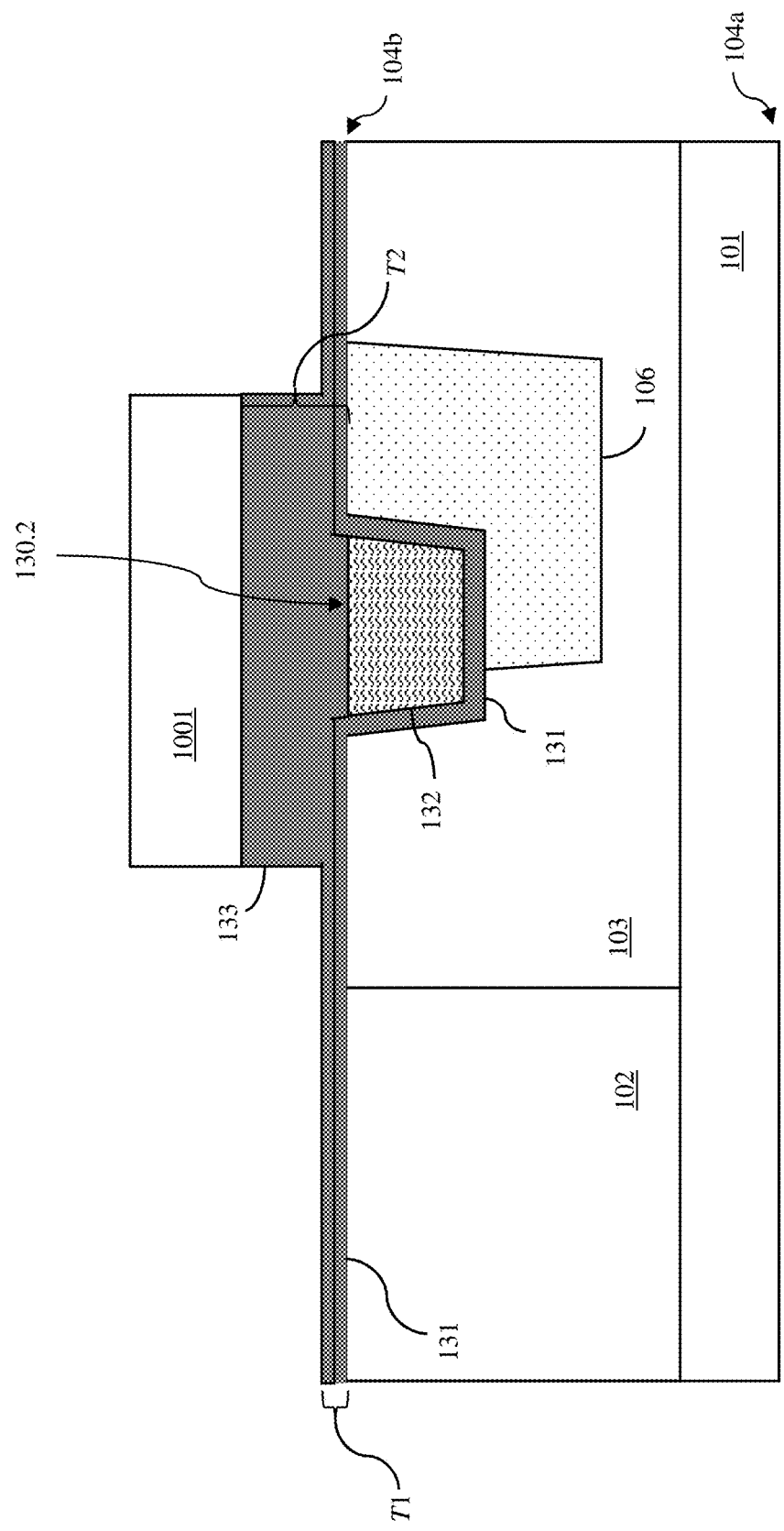

EXTENDED DRAIN FIELD EFFECT TRANSISTOR WITH TRENCH GATE(S) AND METHOD

BACKGROUND

Field of the Invention

The present invention relates to semiconductor structures and, more particularly, to embodiments of a semiconductor structure including an extended drain field effect transistor and to embodiments of a method of forming the semiconductor structure.

Description of Related Art

Key factors considered in modern integrated circuit design include, but are not limited to, performance, power scaling, and size scaling. However, oftentimes improvement with respect to one of these factors can result in an undesirable trade-off with respect to one or more of the other factors. For example, techniques for raising the drive current of extended drain metal oxide semiconductor field effect transistors (MOSFETs) used in high voltage (HV) switching and radio frequency (RF) applications typically result in an unwanted increase in area consumption (i.e., the device footprint) and/or an unwanted decrease in the breakdown voltage.

SUMMARY

Disclosed herein are embodiments of a semiconductor structure including an extended drain metal oxide semiconductor field effect transistor (EDMOSFET) with a primary gate structure and also one or more discrete trench gate structures for increased drive current. Also disclosed herein are embodiments of a method of forming the semiconductor structure.

More particularly, disclosed herein are embodiments of a semiconductor structure. The semiconductor structure can include a semiconductor layer. The semiconductor structure can also include a transistor and, more particularly, an EDMOSFET. The EDMOSFET can include, in the semiconductor layer, a first well (also referred to herein as a body well) having a first type conductivity and a second well (also referred to herein as a drain drift well) abutting the first well and having a second type conductivity that is different from the first type conductivity. The EDMOSFET can further include a trench gate structure in the second well and physically separated from the junction between the first well and the second well (also referred to herein as the body-drain drift junction). The EDMOSFET can further include a primary gate structure on the semiconductor layer traversing the body-drain drift junction. It should be noted that in the EDMOSFET the gate conductor materials of the trench and primary gate structures are physically separated by gate dielectric material. Thus, the trench gate structure can be separately contacted and either tied to the same voltage source as the primary gate structure for increased drive current or tied to a different voltage source for independent biasing (e.g., to selectively adjust the drive current).

In some embodiments, the EDMOSFET can include multiple trench gate structures for even greater drive current control. Specifically, in some embodiments, the semiconductor structure can include a semiconductor layer. The semiconductor structure can also include an EDMOSFET. The EDMOSFET can include, in the semiconductor layer, a first well (also referred to herein as a body well) having a first type conductivity and a second well (also referred to herein as a drain drift well) abutting the first well and having a second type conductivity that is different from the first type conductivity. The EDMOSFET can further include multiple trench gate structures in the second well. Specifically, the EDMOSFET can include a first trench gate structure in the second well abutting one side of an isolation region and a second trench gate structure in the second well positioned laterally between and physically separated from the first trench gate structure and the junction between the first well and the second well (also referred to herein as the body-drain drift junction). The EDMOSFET can further include a primary gate structure on the semiconductor layer traversing the body-drain drift junction. It should be noted that in this EDMOSFET the gate conductor materials of the multiple trench gate structures and the primary gate structure are physically separated by gate dielectric material. Additionally, each trench gate structure can be separately contacted and either tied to the same voltage source as the primary gate structure for increased drive current or tied to a different voltage source(s) for independent biasing (e.g., to selectively adjust the drive current).

Also disclosed herein are embodiments of a method of forming the above-described semiconductor structure embodiments. For example, the method can include accessing a semiconductor layer and forming a transistor and, more particularly, an extended drain metal oxide semiconductor field effect transistor (EDMOSFET) using the semiconductor layer. The EDMOSFET can specifically be formed so that it includes, in the semiconductor layer, a first well (also referred to herein as a body well) having a first type conductivity and a second well (also referred to herein as a drain drift well) abutting the first well and having a second type conductivity that is different from the first type conductivity. The EDMOSFET can further be formed so that it includes a trench gate structure in the second well and physically separated from the junction between the first well and the second well (also referred to herein as the body-drain drift junction). Optionally, more than one trench gate structure can be formed in the drain drift region. The EDMOSFET can further be formed so that it includes a primary gate structure on the semiconductor layer traversing the body-drain drift junction and so that the gate conductor materials of the trench gate structure(s) and the primary gate structure are physically separated by gate dielectric material.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 1A(1)-1A(2) are different cross-sections of an embodiment of a semiconductor structure including an extended drain metal oxide semiconductor field effect transistor (EDMOSFET) with a trench gate structure;

FIGS. 1B(1)-1B(2) are different cross-sections of another embodiment of a semiconductor structure including an EDMOSFET with a trench gate structure;

FIGS. 1C(1)-1C(3) are different cross-sections of an of a semiconductor structure including an EDMOSFET with multiple trench gate structures;

FIG. 4 is a cross-section diagram illustrating a partially completed semiconductor structure formed according to the flow diagram of FIG. 3;

FIGS. 5A-5F are cross-section diagrams illustrating alternative partially completed semiconductor structures formed according to the flow diagram of FIG. 3;

FIGS. 11A and 11B are cross-section diagrams illustrating alternative partially completed semiconductor structures formed according to the flow diagram of FIG. 3;

DETAILED DESCRIPTION

Figure 2C:
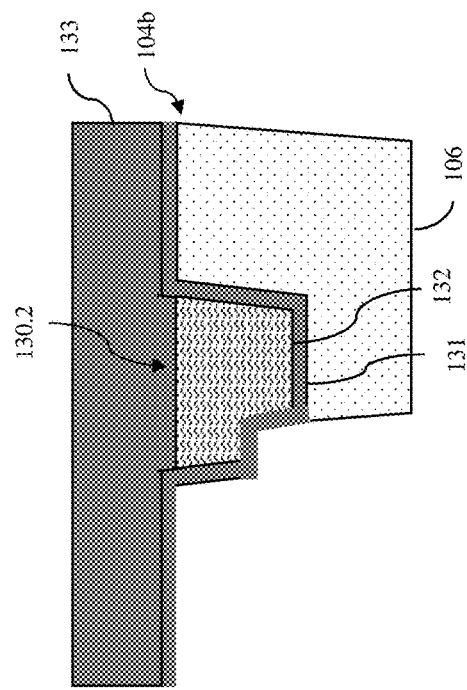
FIGS. 2A-2G are exploded view cross-section diagrams of exemplary EDMOSFET trench gate structures that could be incorporated into the disclosed semiconductor structures.

As mentioned above, key factors considered in modern integrated circuit design include, but are not limited to, performance, power scaling, and size scaling. However, oftentimes improvement with respect to one of these factors can result in an undesirable trade-off with respect to one or more of the other factors. For example, techniques for raising the drive current of extended drain metal oxide semiconductor field effect transistors (EDMOSFETs) used in high voltage (HV) switching and radio frequency (RF) applications typically result in an unwanted increase in area consumption (i.e., the device footprint) and/or an unwanted decrease in the breakdown voltage.

In view of the foregoing, disclosed herein are embodiments of a semiconductor structure including an extended drain metal oxide semiconductor field effect transistor (EDMOSFET). The EDMOSFET can include a semiconductor layer and, in the semiconductor layer, a body well, which has a source region therein, and a drain drift well, which abuts the body well and has a drain region therein. A trench gate structure can be in the drain drift well positioned laterally between the body-drain drift junction and an internal shallow trench isolation (STI) region. The internal STI region can be between the trench gate structure and the drain region. A primary gate can be on the top surface of the semiconductor layer traversing the body-drain drift junction and can optionally extend over the trench gate structure. Gate dielectric material can physically separate gate conductor materials of the primary and trench gate structures. Thus, the trench gate structure can be separately contacted and either tied to the same voltage source as the primary gate structure for increased drive current or tied to a different voltage source for independent biasing (e.g., to selectively adjust the drive current). Optionally, the EDMOSFET can include more than one such trench gate structure. By using the disclosed EDMOSFET structure with independently biasable trench gate structure(s), drive current can be increased while avoiding or at least minimizing a corresponding increase in area consumption and/or a corresponding decrease in breakdown voltage. Also disclosed herein are method embodiments for forming such a semiconductor structure.

More particularly, disclosed herein are embodiments of a semiconductor structure (e.g., see semiconductor structure 100A of FIGS. 1A(1)-1A(2), 100B of FIGS. 1B(1)-1B(2), and 100C of FIGS. 1C(1)-1C(3). In each of the embodiments, the semiconductor structure 100A, 100B, 100C can include a monocrystalline semiconductor layer 101. This monocrystalline semiconductor layer 101 can be a bulk semiconductor layer (e.g., a bulk silicon layer) with a bottom surface 104a (referred to herein as a first surface) and a top surface 104b (referred to herein as a second surface) opposite the bottom surface 104a (as illustrated). However, it should be understood that the figures are not intended to be limiting. Alternatively, the monocrystalline semiconductor layer 101 could be, for example, a semiconductor layer of a semiconductor-on-insulator structure (e.g., a monocrystalline silicon layer of a silicon-on-insulator (SOI) structure).

In each of the embodiments, the semiconductor structure 100A, 100B, 100C can also include a transistor and, more particularly, an extended drain metal oxide semiconductor field effect transistor (EDMOSFET) 150A, 150B, 150C. One or more dielectric layers can cover the EDMOSFET 150A, 150B, 150C. For example, a thin conformal contact etch stop layer (CESL) 161 can be above the EDMOSFET 150A, 150B, 150C. This thin CESL layer 161 can be, for example, a thin silicon nitride layer. Furthermore, a blanket interlayer dielectric (ILD) material layer 162 can be on the CESL layer 161. Optionally, the CESL 161 can have intrinsic stress to improve charge carrier mobility. For example, in the case of an NFET, the CESL can be tensilely strained to improve electron mobility; whereas, in the case of a PFET, the CESL can be compressively strained to improve hole mobility. The ILD material layer 162 can be, for example, a silicon dioxide layer, a doped silicon glass layer (e.g., a phosphosilicate glass (PSG) layer or a borophosphosilicate glass (BPSG) layer), or any other suitable ILD material layer.

The EDMOSFET 150A, 150B, 150C can include an active device area in the semiconductor layer 101. Boundaries of the active device region can, for example, be defined by shallow trench isolation (STI) regions in the semiconductor layer. Those skilled in the art will recognize that a STI region refers to a structure including a trench, which extends into the semiconductor layer 101 from the top surface 104b and which is filled with one or more layers of isolation material (e.g., silicon dioxide or some other suitable isolation material). To avoid clutter in the drawings, STI regions that define the boundaries of the active device region are not shown in the figures. The EDMOSFET 150A, 150B, 150C can further include, within the active device region in the semiconductor layer 101, an internal STI region 106, as discussed in greater detail below. In any case, the bottom of the STI region(s) will be above the level of the bottom surface 104a of the semiconductor layer 101.

The EDMOSFET 150A, 150B, 150C can further include, within the active device region in the semiconductor layer 101, multiple different doped regions. These doped regions are described below as having either a first type conductivity or a second type conductivity that is different from the first type conductivity. It should be understood that the first type conductivity and the second type conductivity are either P-type conductivity and N-type conductivity, respectively, or N-type conductivity and P-type conductivity, respectively, depending upon whether the EDMOSFET is an N-type field effect transistor (NFET) or a P-type field effect transistor (PFET). Specifically, if the EDMOSFET is an NFET, then the first type conductivity refers to P-type conductivity and the second type conductivity refers to N-type conductivity. However, if the EDMOSFET is a PFET, then the first type conductivity refers to N-type conductivity and the second type conductivity refers to P-type conductivity. See the detailed discussion below regarding different dopants that can be employed in semiconductor materials to achieve P-type conductivity or N-type conductivity.

In any case, the doped regions can include wells (also referred to herein as dopant implant regions). The wells can include a first well 102 (also referred to herein as a body well) with the first type conductivity at a relatively low conductivity level (e.g., a P− first well in the case of an NFET or an N− first well in the case of a PFET). The first well 102 can extend from the top surface 104b of the semiconductor layer 101 to some depth below the level of the bottom of the STI region 106. If the semiconductor layer 101 is a bulk semiconductor layer, as illustrated, this first well 102 could extend from the top surface 104b of the semiconductor layer 101 to some depth above the level of the bottom surface 104a of the semiconductor layer 101 and below the level of the bottom of the STI region(s), as illustrated. If the semiconductor layer 101 is a semiconductor layer of a semiconductor-on-insulator structure, this first well 102 could optionally extend the full thickness of the semiconductor layer. The wells can also include a second well 103 (also referred to herein as a drain drift well) with the second type conductivity at a relatively low conductivity level (e.g., a N− second well in the case of an NFET or a P− second well in the case of a PFET). The second well 103 could extend from the top surface 104b of the semiconductor layer 101 to some depth below the level of the bottom of the STI region 106. If the semiconductor layer 101 is a bulk semiconductor layer, as illustrated, this second well 103 could extend from the top surface 104b of the semiconductor layer 101 to some depth above the level of the bottom surface 104a of the semiconductor layer 101 and below the level of the bottom of the STI region(s), as illustrated. If the semiconductor layer 101 is a semiconductor layer of a semiconductor-on-insulator structure, this second well 103 could optionally extend the full thickness of the semiconductor layer. In any case, the bottoms of the wells 102-103 can be at the same level (as illustrated) or, alternatively, at different levels.

The doped regions can also include a source region 111 in the first well 102 and a drain region 112 in the second well 103. The source region 111 can specifically be at one end of the device physically separated from the body-drain drift junction 115 and can have the second type conductivity at a relatively high level (e.g., the source region 111 can be an N+ source region in the case of an NFET or a P+ source region in the case of a PFET). The source region 111 can abut an external STI region or, alternatively can abut another semiconductor device (e.g., a source/drain region of another FET) (not shown). Additionally, the source region 111 can be relatively shallow and, more particularly, can extend from the top surface 104b of the semiconductor layer 101 to a depth above the level of the bottom of the internal STI region 106. The drain region 112 can be at the opposite end of the device from the source region 111. The drain region 112 can, like the source region 111, have the second type conductivity at a relatively high level (e.g., the drain region 112 can be an N+ drain region in the case of an NFET or a P+ drain region in the case of a PFET). The drain region 112 can abut an external STI region or, alternatively can abut another semiconductor device (e.g., a source/drain region of another FET) (not shown). Additionally, the drain region 112, like the source region 111, can be relatively shallow and, more particularly, can extend from the top surface 104b of the semiconductor layer 101 to the same depth (D1) as the source region 111. Alternatively, the drain region can be relatively deep and, more particularly, can extend deeper into the semiconductor layer 101 than the source region (as indicated by item number 112' and the dashed line in the figures). That is, the source region 111 can extend a first depth (D1) into the semiconductor layer 101, the drain region 112' can extend a second depth (D2) into the semiconductor layer 101, and the second depth (D2) can be greater than the first depth (D1). The depth of the drain region can be increased during processing to, for example, increase both the linear drain current (IDlin) and the saturation drain current (IDsat) of the EDMOSFET. It should be noted that the source/drain regions can be dopant implant regions. Alternatively, the source/drain regions could have any other suitable source/drain configuration.

It should be noted that the source and drain regions 111-112 can be dopant implant regions that are shallower than the wells 102-103. Alternatively, the source and drain regions 111-112 can have any other suitable source/drain configuration. For example, the source and drain regions can include in situ doped epitaxially semiconductor layers filling (and optionally overfilling) source/drain trenches etched into the semiconductor layer 101.

In any case, as mentioned above, the EDMOSFET 150A, 150B, 150C can include an internal STI region 106. This internal STI region 106 can be within the second well 103, can extend across the width of the active device region (i.e., parallel to the channel width), and can be positioned laterally between the body-drain drift junction 115 and the drain region 112. On one side, the internal STI region 106 can be physically separated from the body-drain drift junction 115. On the opposite side, the internal STI region 106 can be either immediately adjacent to the drain region 112 (e.g., see the EDMOSFETs 150A and 150C) or physically separated from the drain region 112 by some distance (d) (e.g., see EDMOSFET 150B). The distance (d) between the internal STI region 106 and the drain region 112 can be increased, for example, to increase the length of the drain drift region and thereby increase breakdown voltage of the EDMOSFET.

The EDMOSFET 150A, 150B, 150C can further include at least one trench gate structure 130.2. In some embodiments, the EDMOSFET can include a single trench gate structure (e.g., see the single trench gate structure 130.2 in EDMOSFET 150A of FIGS. 1A(1)-1A(2) and the EDMOSFET 150B of FIGS. 1B(1)-1B(2)). In other embodiments, the EDMOSFET can include multiple trench gate structures (e.g., see the pair of trench gate structures 130.2 and 130.3 in the EDMOSFET 150C of FIGS. 1C(1)-1C(3)). In each of the embodiments, the trench gate structure 130.2 can be in the second well 103 physically separated from the body-drain drift junction 115 and further positioned laterally between the body-drain drift junction 115 and the internal STI region 106. In the case of the EDMOSFET 150C, the additional trench gate structure 130.3 can be positioned laterally between and physically separated from the body-drain drift junction 115 and the trench gate structure 130.2.

Each trench gate structure 130.2 (and 130.3, if applicable) can include a trench, a gate dielectric layer 131 lining the bottom and side surfaces of the trench, and a gate conductor layer 132 on the gate dielectric layer 131. The gate conductor layer 132 can essentially fill the trench. The gate dielectric layer 131 can include one or more layers of gate dielectric material and the gate conductor layer 132 can include one or more layers of gate conductor material. The gate dielectric layer 131 can be a silicon dioxide layer, a silicon oxynitride layer, a high-K gate dielectric layer or a layer or layers of any other suitable gate dielectric materials. The gate conductor layer 132 can be an in situ-doped polysilicon or amorphous silicon layer. The doped polysilicon or amorphous silicon layer can have, for example, the second type conductivity at a relatively high conductivity level (e.g., an N+ poly or amorphous silicon gate conductor layer in the case of an NFET and a P+ poly or amorphous silicon gate conductor layer in the case of a PFET). Alternatively, the gate conductor layer 132 could be a layer or layers of any other suitable gate conductor materials (e.g., a thin gate metal or metal alloy layer and an in situ-doped poly or amorphous silicon layer on the thin gate metal or metal alloy layer). As illustrated, the gate dielectric layer 131 can have portions on the top surface 104*b* of the semiconductor layer 101 and further onto the top surface of the internal STI region 106 adjacent to the trench gate structure.

Figure 2A:
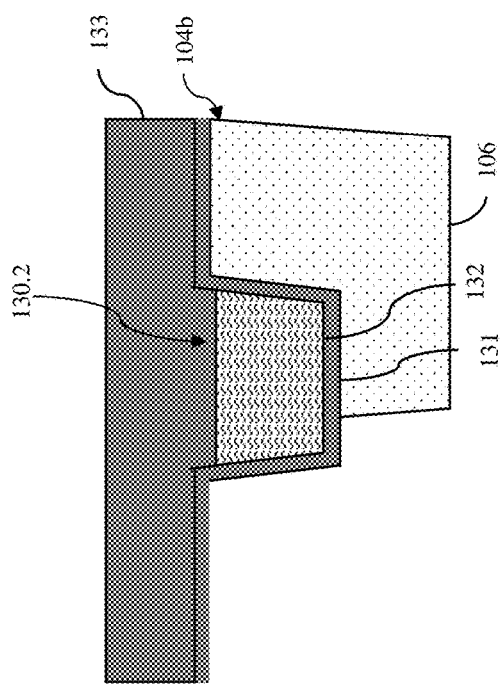
Figure 2B:
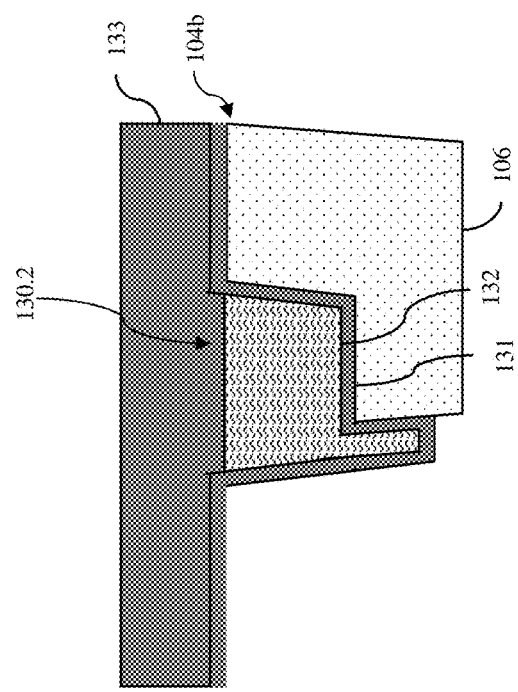
Figure 2E:
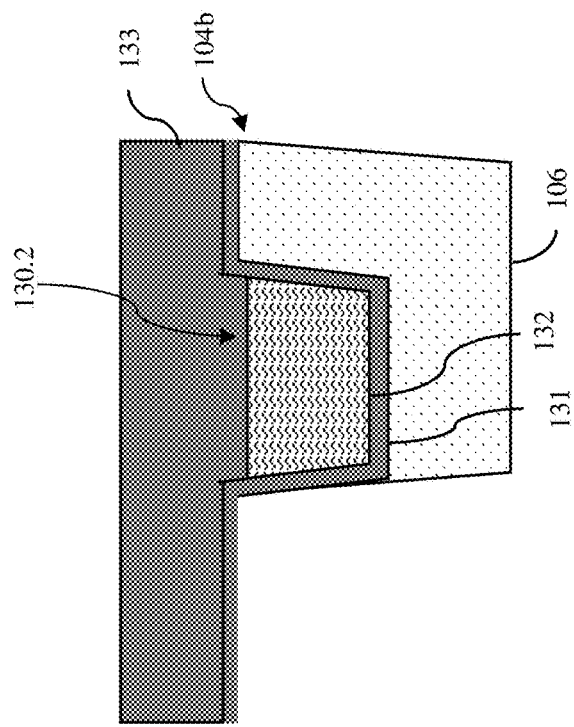
Figure 2D:
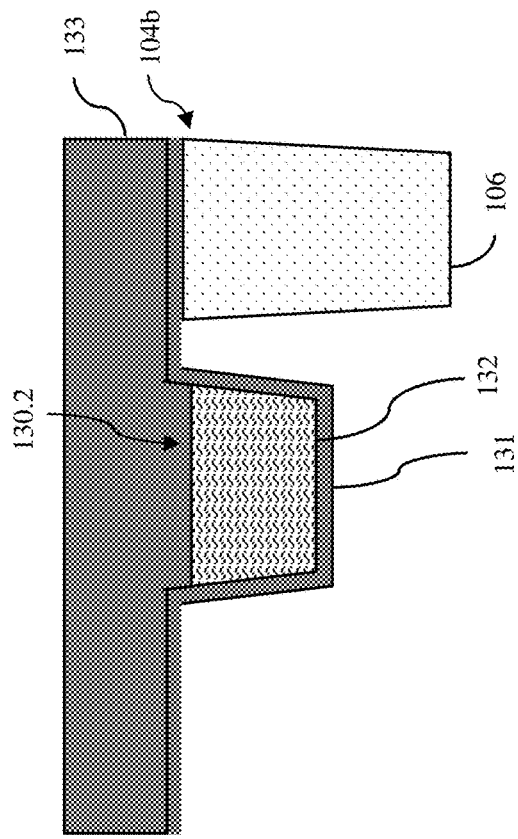
Figure 2G:
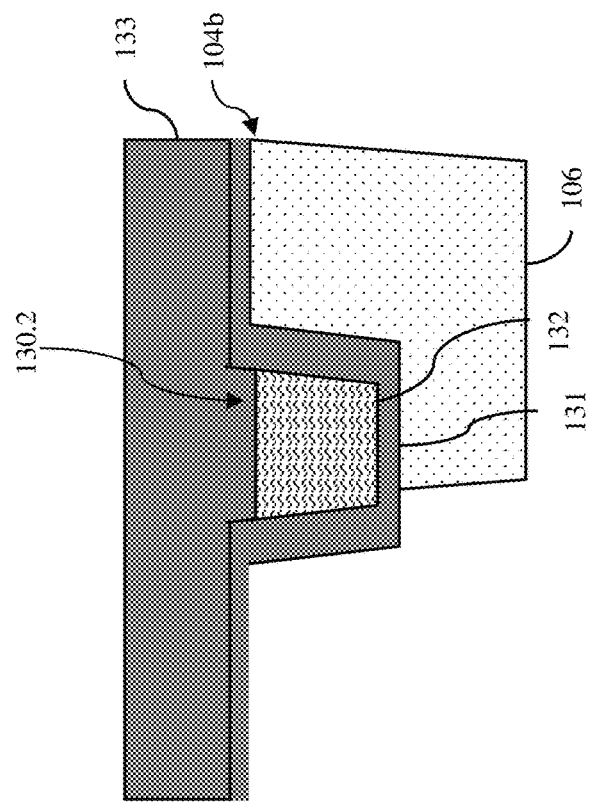
Figure 2F:
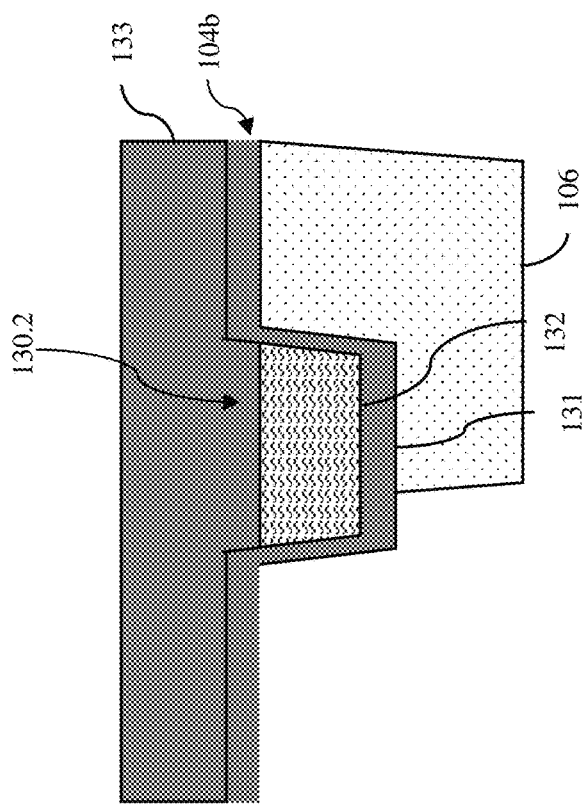

FIGS. 2A-2G are cross-section illustrations of alternative configurations for the trench gate structure 130.2 that could be incorporated into the disclosed embodiments. For example, in the trench gate structure 130.2, the trench thereof can extend downward from the level of the top surface 104*b* of the semiconductor layer 101. In some embodiments, the trench (and thus the trench gate structure 130.2) can be positioned at the interface between the semiconductor layer 101 and the internal STI region 106 (e.g., see the trench gate structure 130.2 in each of the EDMOSFETs 150A-150C shown in FIGS. 1A(1), 1B(1) and 1C(1), see also FIG. 2A). In this case, the trench (and thus the trench gate structure 130.2) has a first side extending into the semiconductor layer 101 and a second side extending into the internal STI region 106. It should be noted that in the trench gate structure 130.2 shown n FIGS. 1A(1), 1B(1) and 1C(1) and also in FIG. 2A, the bottom of the first side of the trench in the semiconductor layer 101 and the bottom of the second side of the trench in the internal STI region 106 are at approximately the same level and above the level of the bottom of the internal STI region 106. However, it should be understood that these figures are not intended to be limiting. Alternatively, and depending on the etch process used to form the trench and, particularly, depending upon whether the etchant used was more selective to the semiconductor material of the semiconductor layer or to the isolation material of the internal STI region 106, the bottoms of the two sides of the trench may be at different levels (e.g., see FIGS. 2B and 2C). Furthermore, instead of being located at the interface between the semiconductor layer 101 and the internal STI region 106 as shown in FIGS. 2A-2C, the trench (and thus the trench gate structure 130.2) can be located in the semiconductor layer only and physically separated from the internal STI region 106 (e.g., see FIG. 2D) or in the internal STI region 106 adjacent to the interface between the semiconductor layer 101 and the internal STI region 106 (e.g., see FIG. 2E). Furthermore, it should be noted that in the trench gate structure 130.2 shown in FIGS. 1A(1), 1B(1) and 1C(1) and also as shown in FIGS. 2A-2E, the gate dielectric layer 131 has a uniform thickness. However, it should be understood that the figures are not intended to be limiting. Alternatively, the gate dielectric layer 131 can have non-uniform thickness. For example, the thickness of the gate dielectric layer 131 could be thicker on the bottom of the trench as compared to the sidewalls (e.g., see FIG. 2F) or vice versa (e.g., see FIG. 2G). It should be understood that in the EDMOSFET 150C, the gate structure 130.3 can be located in the semiconductor layer only and can have essentially the same dielectric/conductor configuration as the trench gate structure 130.2. In any case, the trench gate structure 130.2 (and the trench gate structure 130.3, if applicable) can, like the internal STI region 106, extend across the full width of the active device region (i.e., parallel to the channel width) (e.g., see FIGS. 1A(2), 1B(2) and 1C(2)-(3)). Furthermore, at least one end 135 of each trench gate structure 130.2 (and if applicable 130.3) can be silicided (e.g., see metal silicide layers 180) and contacted (e.g., see contacts 193 extending through the dielectric layers 161-162 and landing on the ends of the trench gate structure 130.2, see also contacts 194 extending through the dielectric layers 161-162 and landing on the ends of the trench gate structure 130.3). The metal silicide layers 180 can be, for example, layers of cobalt silicide (CoSi), nickel silicide (NiSi), tungsten silicide (WSi), titanium silicide (TiSi), or any other suitable metal silicide material.

The EDMOSFET 150A, 150B, 150C can further include a primary gate structure 130.1 on the semiconductor layer 101 traversing the body-drain drift junction 115 and extending laterally across the width of the device. This primary gate structure 130.1 can be, for example, a gate-first gate structure, such as a gate-first polysilicon gate structure or, alternatively, a gate-first high-k metal gate structure. Alternatively, the primary gate structure 130.1 could be a gate-last gate structure, such as a replacement metal gate (RMG) structure). Such gate structures are well known in the art. For example, a gate-first polysilicon gate structure will typically include a gate oxide layer (e.g., a silicon dioxide layer, a silicon oxynitride layer, or some other suitable gate dielectric layer) and a doped polysilicon gate conductor layer on the gate oxide layer. A metal gate structure (e.g., either a gate-first high-k metal gate structure or a RMG structure) will typically include a high-K gate dielectric layer and one or more gate conductor layers (including at least one work function metal or metal alloy layer) on the gate dielectric layer. Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The work function metal or metal alloy layer can have a work function that is suitable for both NFET and PFET operations. Alternatively, the work function metal or metal alloy layer can have a work function that is optimal for either NFET performance or PFET performance. The optimal gate conductor work function for an NFET is, for example, between 3.9 eV and about 4.2 eV. Exemplary metals (and metal alloys) having a work function within this range include, but are not limited to, hafnium, zirconium, titanium, tantalum, aluminum, lanthanum, and alloys thereof, such as, hafnium carbide, zirconium carbide, titanium carbide, tantalum carbide, and aluminum carbide. The optimal gate conductor work function for a PFET is, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). A metal gate structure will also typically include one or more additional gate conductor layers on the work function metal or metal alloy layer. The additional gate conductor layers can be, for example, a doped polysilicon layer and/or a fill metal or metal alloy layer (e.g., tungsten, cobalt, aluminum, or any other suitable fill metal or metal alloy layer).

Regardless of the type of gate structure it is, the gate conductor material(s) of the primary gate structure 130.1 can be physically separated from the gate conductor material(s) of the trench gate structure 130.2 (and if applicable 130.3) by gate dielectric material. Specifically, in the EDMOSFET 150A, 150B, 150C, an additional gate dielectric layer 133 can be on the top surface of the gate conductor layer 132 of the trench gate structure(s). The additional gate dielectric layer 133 can be the same gate dielectric material as the gate dielectric layer 131 or a different gate dielectric material. The additional gate dielectric layer 133 can be, for example, a silicon dioxide layer, a silicon oxynitride layer, a high-K gate dielectric layer or a layer or layers of any other suitable gate dielectric material(s) given the type of gate structure. In some embodiments, the additional gate dielectric layer 133 can extend onto adjacent portions of the gate dielectric layer 131 that are above the top surface of the semiconductor layer 101 outside the trench. Furthermore, in some embodiments, the additional gate dielectric layer 133 can be patterned so as to form a stepped gate dielectric layer including a thin gate dielectric section (T1), which is on the top surface of the semiconductor layer 101 and which extends laterally from the source region 111 over the first well 102 and further over the body-drain drift junction 115, and a thick gate dielectric section (T2), which is on the top surface of the semiconductor layer 101 above the second well 103 and which extends laterally from the thin gate dielectric section (T1) over the trench gate structure(s) and onto the internal STI region 106 and, optionally, completely over the internal STI region 106 (e.g., as shown in FIG. 1(B)(1)). In this case, the thin gate dielectric section (T1) may only include a portion of the gate dielectric layer 131 (as illustrated) or may include a portion of the gate dielectric layer 131 and a thinned portion of the additional gate dielectric layer 133 thereon (not shown). It should be noted that the figures are, however, not intended to be limiting. For example, in other embodiments, the primary gate structure 130.1 could include a planar gate dielectric layer (as opposed to a stepped gate dielectric layer) with an additional gate dielectric layer 133 above the gate conductor layer 132 only and having a top surface essentially co-planar with the top surface of the gate dielectric layer 131. In still other embodiments, the primary gate structure 130.1 could include a planar gate dielectric layer (as opposed to a stepped gate dielectric layer) with an additional gate dielectric layer 133 above the gate conductor layer 132 and also above the top surface of the gate dielectric layer 131. The primary gate structure 130.1 can also include an additional gate conductor layer. The additional gate conductor layer can include one or more layers of gate conductor materials, which are physically separated from the gate conductor layer 132 by gate dielectric materials and, particularly, by the additional gate dielectric layer 133.

For purposes of illustration, the primary gate structure 130.1 is shown in the figures as being a gate-first high-k metal gate structure with a stepped gate dielectric layer and a stack of gate conductor layers on the stepped gate dielectric layer. The stack of gate conductor layers includes: a thin metallic layer 134a (e.g., a work function metal or metal alloy layer), which covers the thin gate dielectric section (T1) and which further extends laterally onto the thick gate dielectric section (T2); an in situ-doped polysilicon layer 134b on the thin metallic layer 134a; and, optionally, a silicide layer 180 on the doped polysilicon layer 134b. The doped polysilicon layer can have, for example, the second type conductivity at a relatively high conductivity level (e.g., an N+ polysilicon layer in the case of an NFET and a P+ polysilicon layer in the case of a PFET). The thick gate dielectric section (T2) can optionally extend laterally beyond the stack of gate conductor layers, as illustrated. Additionally, gate sidewall spacers 185 can be positioned laterally adjacent to the sidewalls of the primary gate structure 130.1 (including adjacent to the sidewall of the thick gate dielectric section (T3), which as illustrated and discussed above, can extend laterally beyond the stack of gate conductor layers). The gate sidewall spacers 185 can be made, for example, of silicon dioxide, silicon nitride, silicon carbon nitride, silicon boron carbon nitride or any other suitable gate sidewall spacer material. It should be noted that the gate sidewall spacer material can be different from one or more of the gate dielectric materials (e.g., from the gate dielectric material of the additional gate dielectric layer 133 and, optionally, from the gate dielectric material of the gate dielectric layer 131) so as to allow for selective etching of the gate sidewall spacer material without etching the gate dielectric material(s) and vice versa, as necessary, during processing. Additionally, if the primary gate structure is a RMG gate structure, the gate sidewall spacer material should be selected to allow for selective removal of a sacrificial gate structure without significantly impacting the gate sidewall spacers so that the RMG can subsequently be formed in a gate opening defined by the gate sidewall spacers.

In any case, as FIGS. 1A(1)-(2), 1B(1)-(2) and 1C(1)-(3), the primary gate structure 130.1 can, optionally, extend over the trench gate structure(s). Furthermore, the trench gate structure(s) can be wider than the primary gate structure 130.1, as measured in a direction parallel to the channel width. That is, the primary gate structure 130.1 can have a first width (W1) and each trench gate structure 130.2 (and if applicable the trench gate structure 130.3) can have a second width (W2) that is greater than the first width (W1). This configuration ensures that the ends 135 of the trench gate structure(s) can be easily contacted (e.g., see contacts 193 and 194). Thus, in addition to biasing the primary gate structure 130.1, the trench gate structure 130.2 (and if applicable the trench gate structure 130.3) can also be electrically biased. Thus, the trench gate structure(s) (which is/are separated from the drain region by the internal STI region 106) can be employed to increase both linear drain current (IDlin) and saturation drain current (IDsat). It should be noted that the trench gate structure 130.2 (and if applicable the trench gate structure 130.3) can be tied to the same voltage source as the primary gate structure 130.1 for increased drive current. Alternatively, the trench gate structure 130.2 (and if applicable the trench gate structure 130.3) could be tied to different voltage source(s) than the primary gate structure 130.1 for independent biasing (e.g., to selectively adjust the drive current).

It should be noted that, with this configuration, the primary gate structure 130.1 in the EDMOSFET 150A, 150B, 150C defines a horizontally-oriented channel region 113 in the first well 102 adjacent to one side of the body-drain drift junction 115 and a horizontally-oriented accumulation region 114a in the second well 103 adjacent to the other side of the body-drain drift junction 115. The trench gate structure(s) in the EDMOSFET 150A, 150B, 150C define additional accumulation region(s) in the second well 103. That is, the trench gate structure 130.2 in the EDMOSFET 150A, 150B, 150C defines an additional accumulation region 114b in the second well 103. As illustrated, this additional accumulation region 114b at least includes an essentially vertically-oriented section adjacent to a sidewall of the trench gate structure 130.2. The trench gate structure 130.3 in the EDMOSFET 150C defines another additional accumulation region 114c. As illustrated, this additional accumulation region 114c includes both horizontally and vertically-oriented sections adjacent to sidewalls and a bottom of the trench gate structure 130.3.

Figure 3:
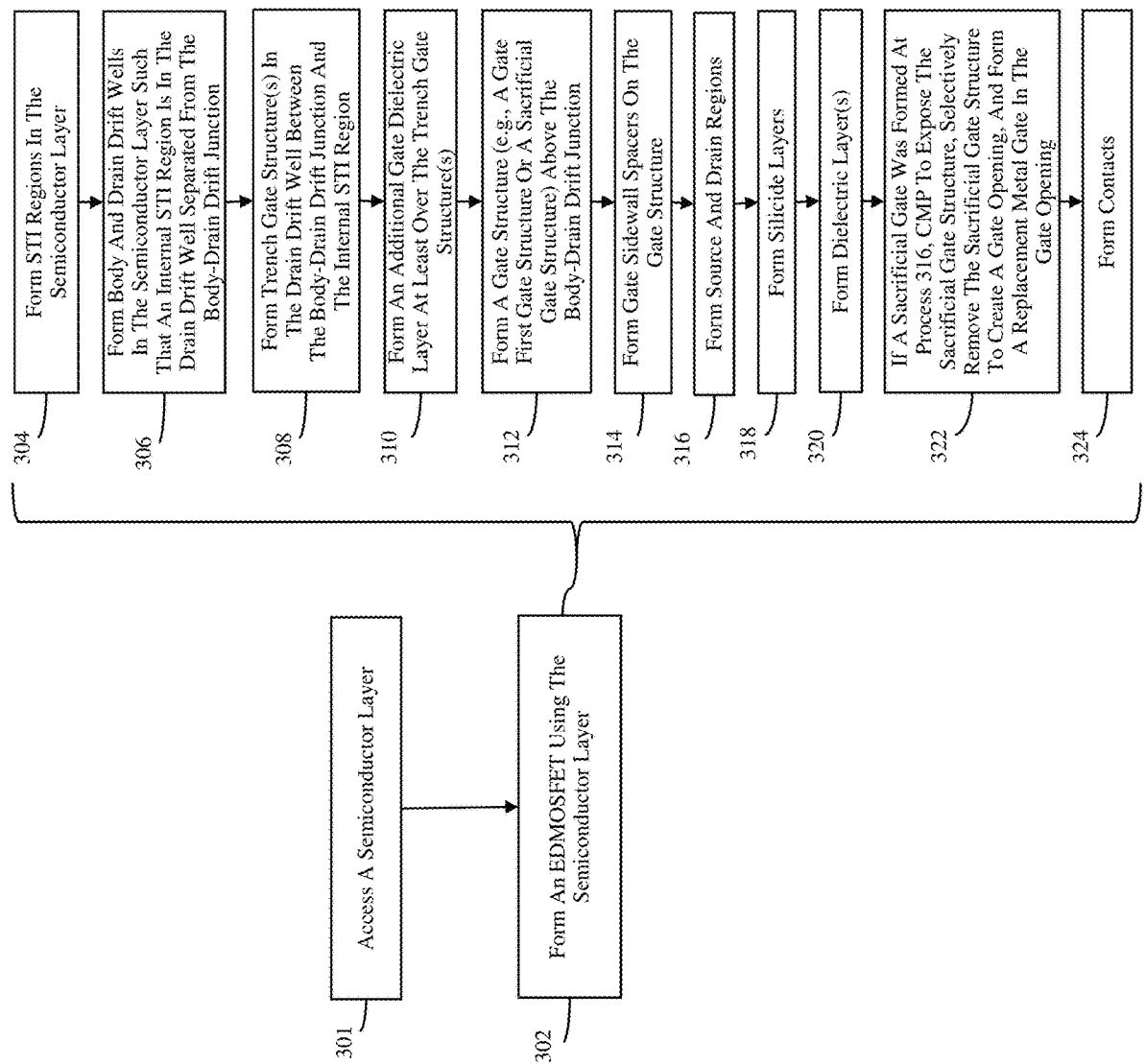
FIG. 3 is a flow diagram illustrating method embodiments for forming the disclosed semiconductor structures having an EDMOSFET with one or more trench gate structures.

Referring to the flow diagram of FIG. 3, also disclosed herein are embodiments of a method forming the above-described semiconductor structure embodiments (e.g., see semiconductor structure 100A of FIGS. 1A(1)-1A(2), 100B of FIGS. 1B(1)-1B(2), and 100C of FIGS. 1C(1)-1C(3).

The method can include accessing a monocrystalline semiconductor layer 101 (see process 301 and FIG. 4. This monocrystalline semiconductor layer 101 can be a bulk semiconductor layer (e.g., a bulk silicon layer) with a bottom surface 104a (referred to herein as a first surface) and a top surface 104b (referred to herein as a second surface) opposite the bottom surface 104a (as illustrated). However, it should be understood that the figures are not intended to be limiting. Alternatively, the monocrystalline semiconductor layer 101 could be, for example, a semiconductor layer of a semiconductor-on-insulator structure (e.g., a monocrystalline silicon layer of a silicon-on-insulator (SOI) structure).

The method can further include forming an extended drain metal oxide semiconductor field effect transistor (EDMOSFET) using the semiconductor layer 101 (see process 302).

To form the EDMOSFET, shallow trench isolation (STI) regions can be formed using conventional STI processing techniques (see process 304 and FIG. 4). The STI regions can be formed so as to define an active device area in the semiconductor layer 101 (not shown) and further so as to include an internal STI region 106 within the active device region. Additionally, wells (also referred to herein as dopant implant regions) can be formed in the active device region using conventional dopant implantation processes (see process 306 and FIG. 4). It should be noted that in the processes described below semiconductor materials are described as being doped so as to have a first type conductivity or a second type conductivity that is different from the first type conductivity. The first type conductivity and the second type conductivity are either P-type conductivity and N-type conductivity, respectively, or N-type conductivity and P-type conductivity, respectively, depending upon whether the EDMOSFET being formed is an N-type field effect transistor (NFET) or a P-type field effect transistor (PFET). Specifically, if the EDMOSFET being formed is an NFET, then the first type conductivity refers to P-type conductivity and the second type conductivity refers to N-type conductivity. However, if the EDMOSFET being formed is a PFET, then the first type conductivity refers to N-type conductivity and the second type conductivity refers to P-type conductivity. See the detailed discussion below regarding different dopants that can be employed in semiconductor materials to achieve P-type conductivity or N-type conductivity. In any case, the wells formed at process 306 can include a first well 102 (also referred to herein as a body well) with the first type conductivity at a relatively low conductivity level (e.g., a P– first well in the case of an NFET or an N– first well in the case of a PFET). The first well 102 can be formed so that it extends from the top surface 104b of the semiconductor layer 101 to some depth below the level of the bottom of the internal STI region 106. The wells formed at process 306 can also include a second well 103 (also referred to herein as a drain drift well) with the second type conductivity at a relatively low conductivity level (e.g., a N– second well in the case of an NFET or a P– second well in the case of a PFET). The second well 103 can be formed so that it extends from the top surface 104b of the semiconductor layer 101 to some depth below the level of the bottom of the internal STI region 106 and to the same level or a different level than the first well 102). The second well 103 can be further be formed so that it abuts the first well 102, thereby forming a pn junction 115 (referred to herein as the body-drain drift junction).

It should be noted that processes 304-306 should be performed so that the internal STI region 106 is within the second well 103, so that it extends across the width of the active device region (i.e., parallel to the channel width), and so that it is physically separated from the body-drain drift junction 115.

One or more trench gate structures can be formed in the second well 103 physically separated from the body-drain drift junction 115 and further positioned laterally between the body-drain drift junction 115 and the internal STI region 106 (see process 308).

Figure 5A:
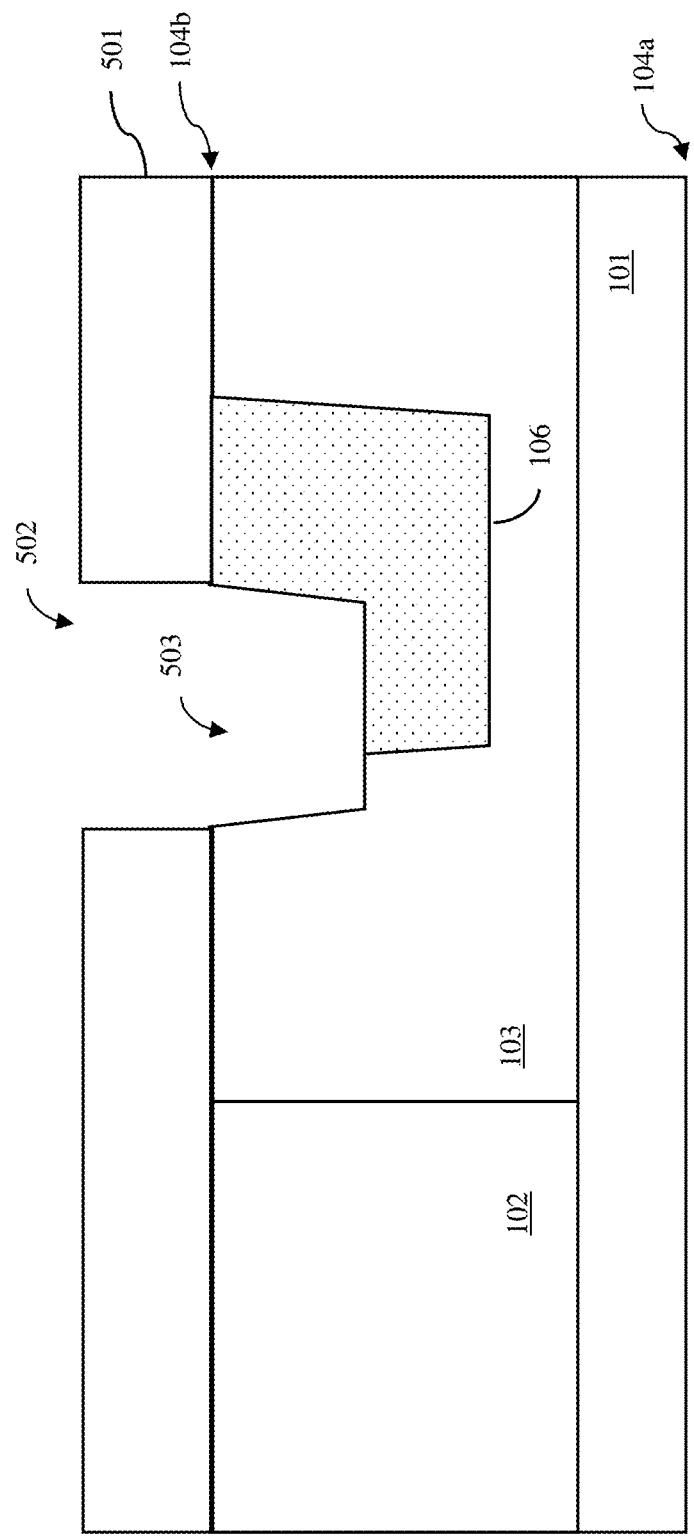
Figure 5B:
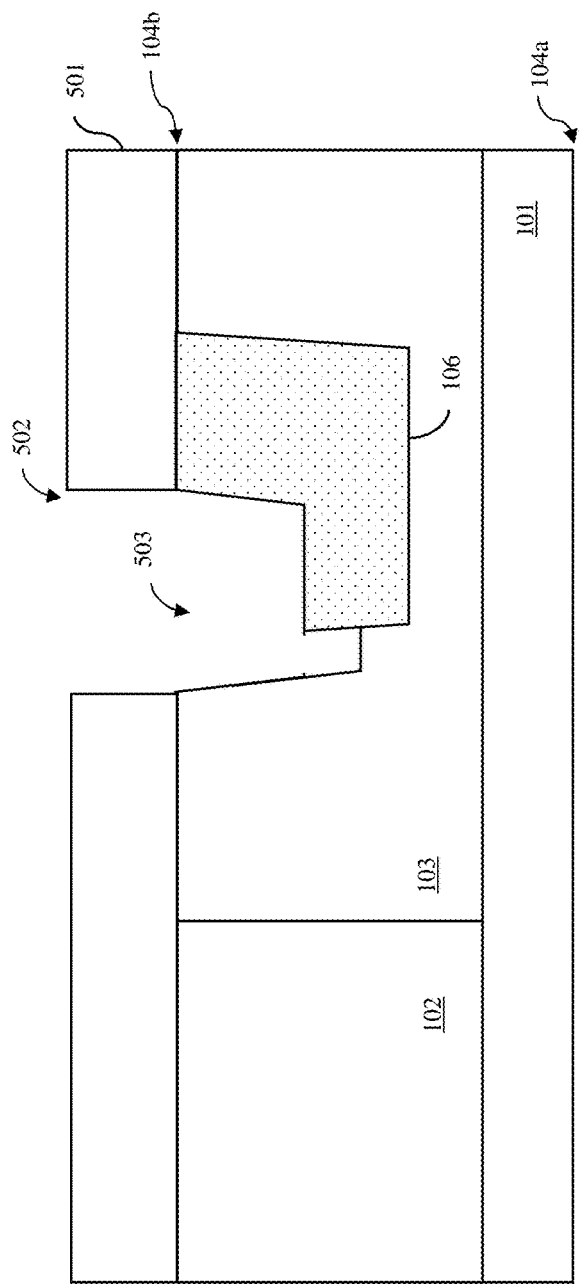
Figure 5C:
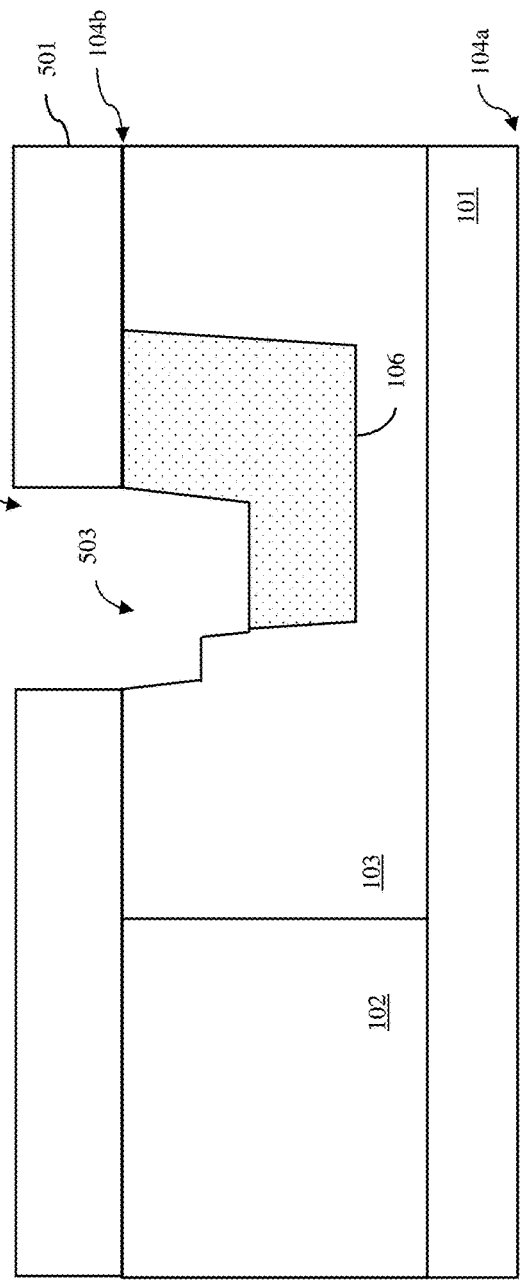
Figure 5F:
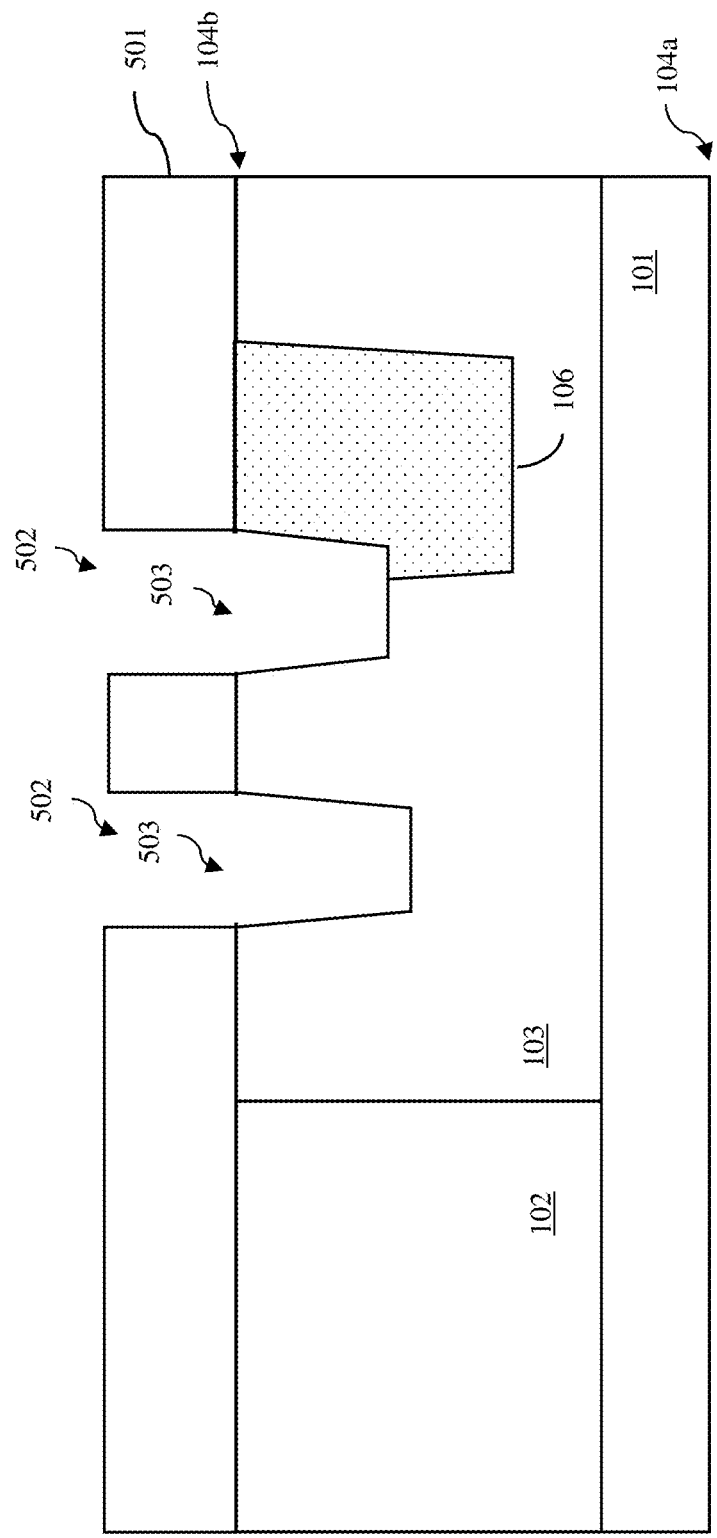

Specifically, to form a trench gate structure at process 308, a mask layer 501 can be formed on the top surface of the semiconductor layer 101. Conventional lithographic patterning and etch processes can be performed to form at least one opening 502 in the mask layer 501 and then an anisotropic etch process can be performed in order to etch corresponding trench(es) 503 aligned below the opening(s) 502. For example, in some embodiments, patterning of an opening 502 in the mask layer 501 and thereby a trench 503 can be performed such that the trench 503 is located in the second well 103 at the interface between the semiconductor layer 101 and the internal STI region 106 and further physically separated from the body-drain drift junction 115 (e.g., see the trench in FIG. 5A). In this case, the trench has a first side extending into the semiconductor layer 101 and a second side extending into the internal STI region 106. It should be noted that in the trench 503 shown in FIG. 5A, the bottom of the first side of the trench 503 in the semiconductor layer 101 and the bottom of the second side of the trench 503 in the internal STI region 106 are at approximately the same level and above the level of the bottom of the internal STI region 106. However, it should be understood that these figures are not intended to be limiting. For example, depending upon whether the etchant used to form the trench is more selective to the semiconductor material of the semiconductor layer or to the isolation material of the internal STI region 106, the bottoms of the two sides of the trench 503 may end up at different levels (e.g., see FIGS. 5B and 5C). Furthermore, in some embodiments, patterning of an opening 502 in the mask layer 501 and thereby a trench 503 can be performed such that instead of being located at the interface between the semiconductor layer 101 and the internal STI region 106 as shown in FIGS. 5A-5C, the trench 503 can be located in the semiconductor layer only and physically separated from the internal STI region 106 (e.g., see FIG. 5D) or in the internal STI region 106 adjacent to the interface between the semiconductor layer 101 and the internal STI region 106 (e.g., see FIG. 5E). Finally, some embodiments, multiple openings 502 can be patterned in the mask layer 501 such that the anisotropic etch process results in multiple trenches 503 within the drain drift region (e.g., a first trench at the interface between the semiconductor layer 101 and the internal STI region 106 and a second trench positioned laterally between the body-drain drift junction 115 and the first trench, as shown in FIG. 5F). For purposes of illustration, the remaining processes are described below and illustrated in the figures with respect to the partially completed structure shown in FIG. 5A.

Figure 6A:
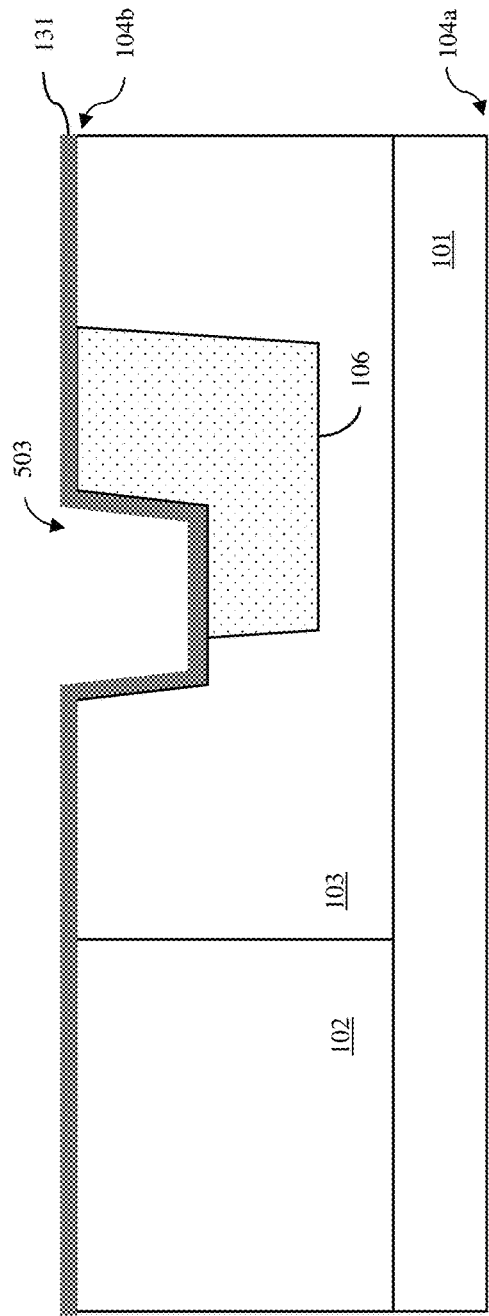
FIGS. 6A-6C are cross-section diagrams illustrating alternative partially completed semiconductor structures formed according to the flow diagram of FIG. 3.
Figure 6B:
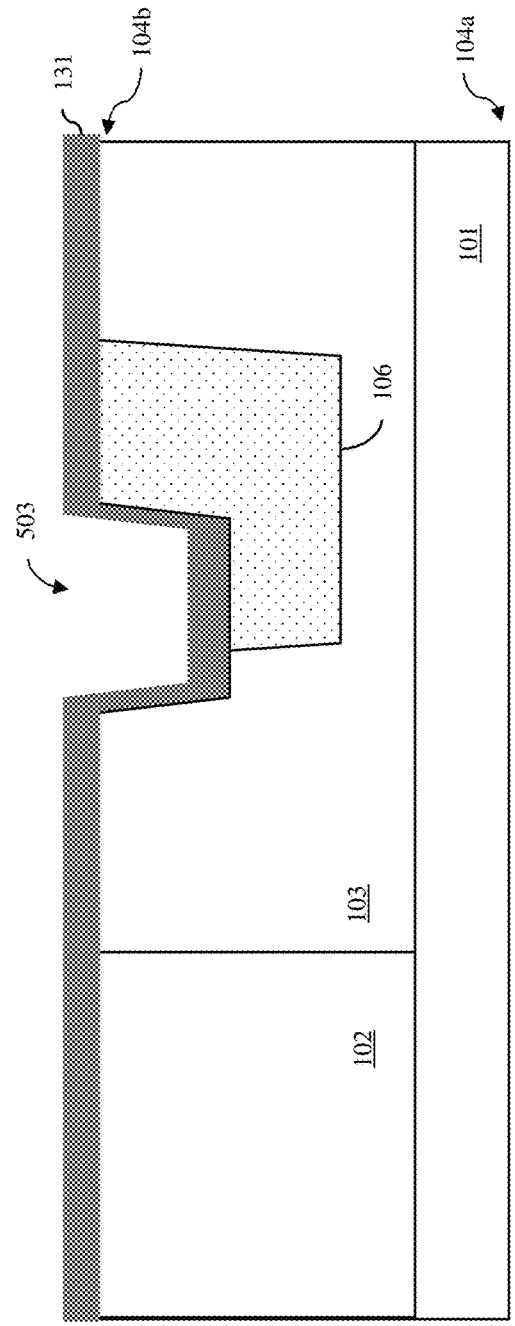
Figure 6C:
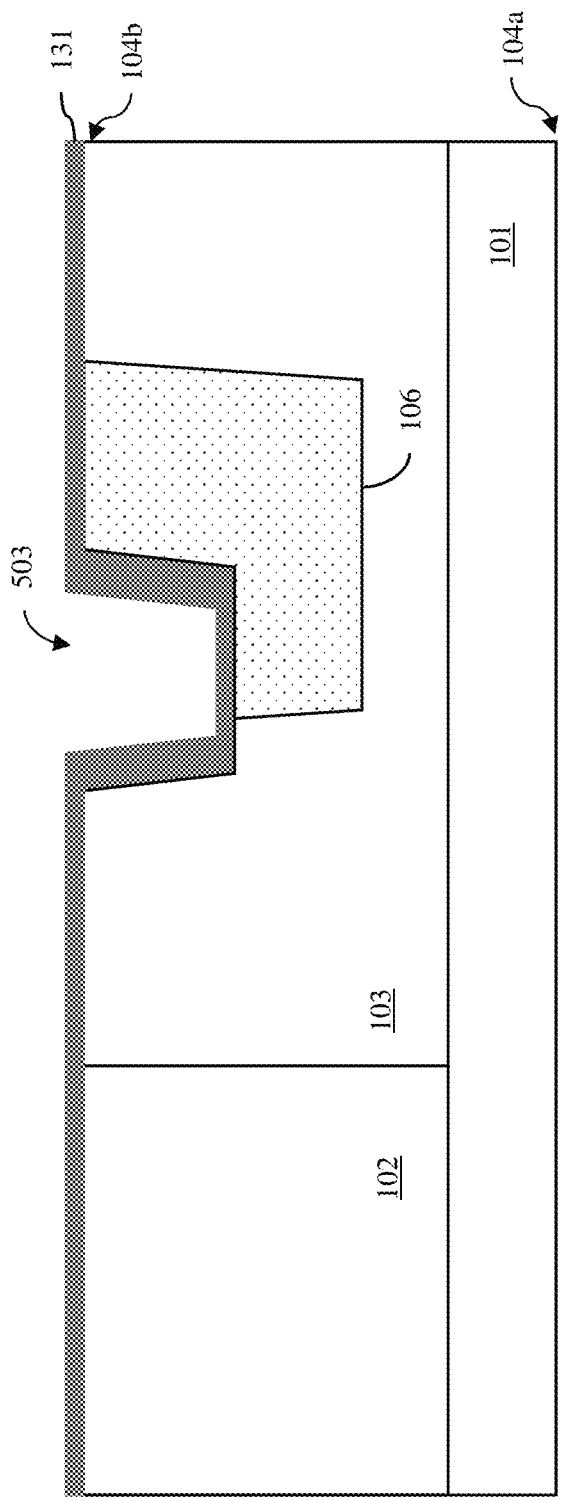

Following trench 503, the mask layer 501 can be selectively removed. Then, a gate dielectric layer 131 can be formed (e.g., conformally deposited) so as to line the bottom and side surfaces of the trench 503 and further cover the exposed top surfaces of the semiconductor layer 101 and internal STI region 106 (see FIG. 6A or alternatively FIG. 6B or 6C). The gate dielectric layer 131 can include one or more layers of gate dielectric material and the gate conductor layer 132 can include one or more layers of gate conductor material. The gate dielectric layer 131 can be a silicon dioxide layer, a silicon oxynitride layer, a high-K gate dielectric layer or a layer or layers of any other suitable gate dielectric materials. It should be noted that the gate dielectric layer 131 can be deposited so that it has an essentially uniform thickness, as illustrated in FIG. 6A. Alternatively, the gate dielectric layer 131 can be deposited so as to be thicker on the bottom of the trench as compared to the sidewalls (e.g., see FIG. 6B) or vice versa (e.g., see FIG. 6C). For purposes of illustration, the remaining processes are described below and illustrated in the figures with respect to the partially completed structure shown in FIG. 6A.

Figure 7:
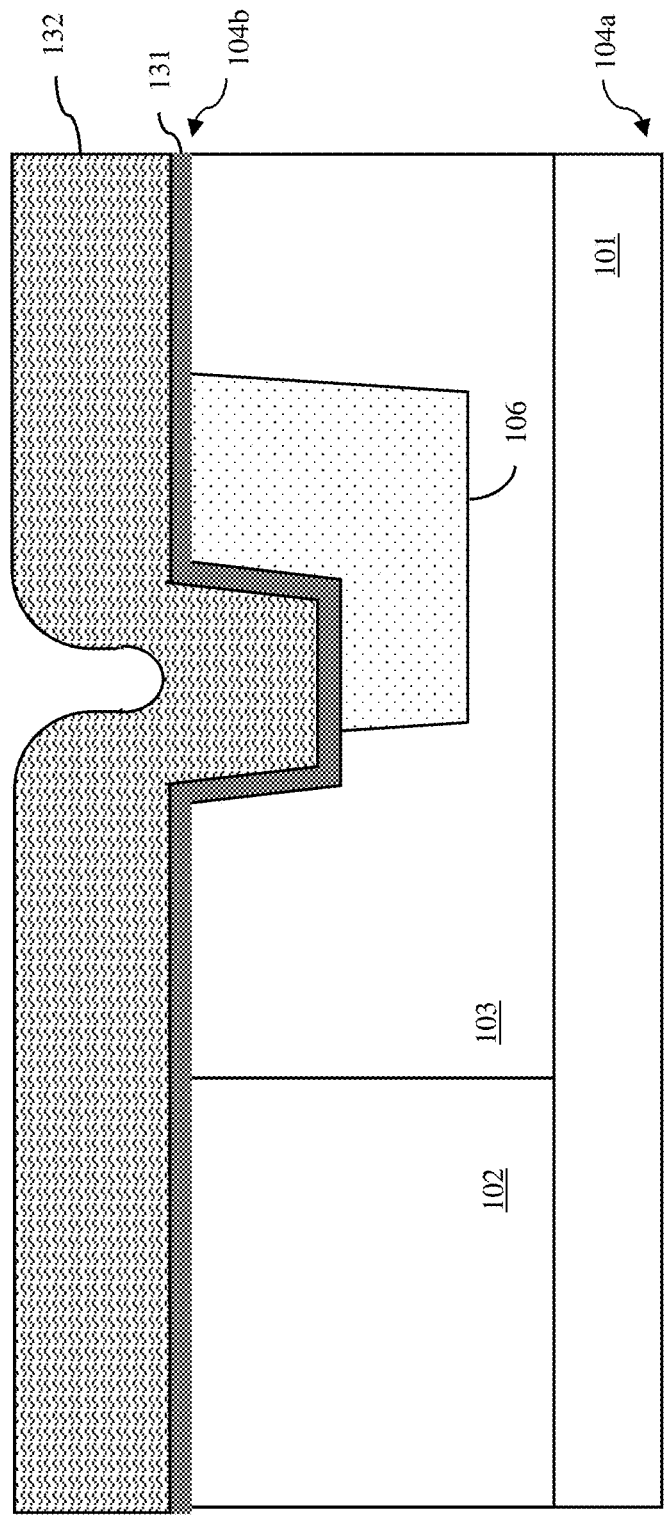
FIGS. 7-9 are cross-section diagrams illustrating partially completed semiconductor structures, respectively, according to the flow diagram of FIG. 3.
Figure 8:
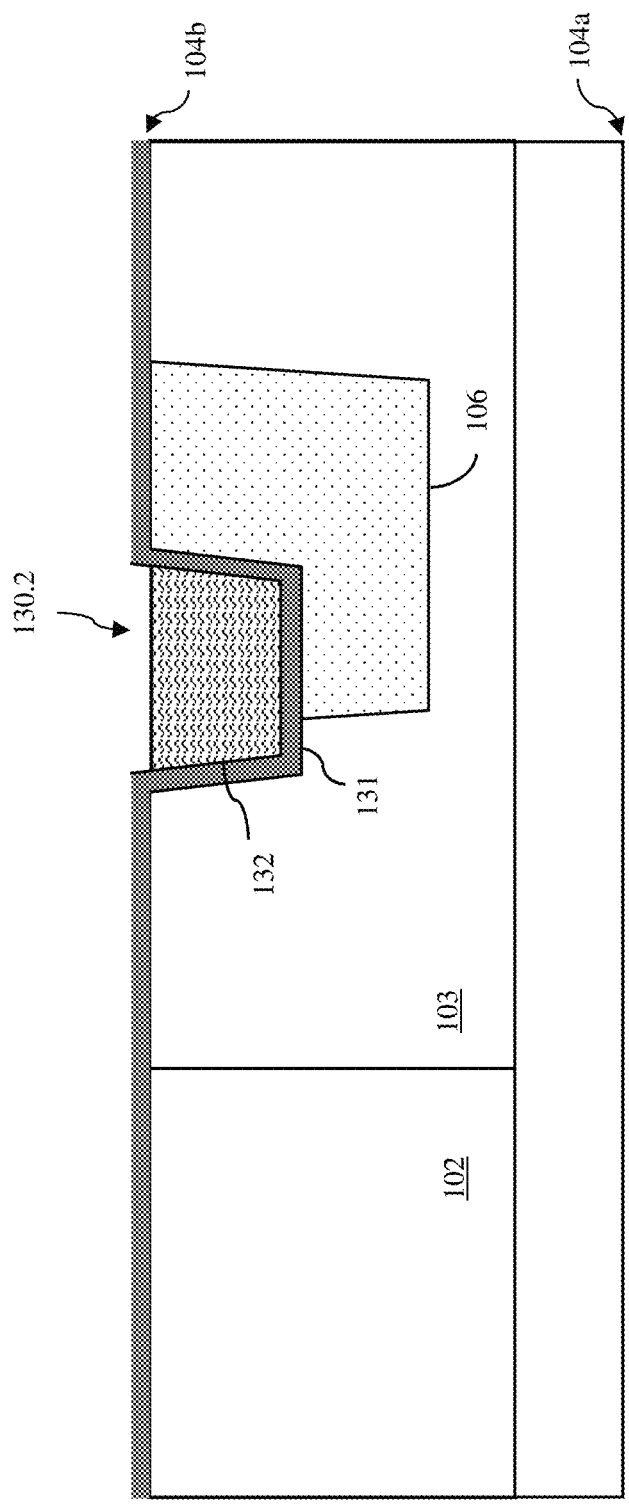

A gate conductor layer 132 can subsequently be formed on the gate dielectric layer 131. For example, an in situ-doped polysilicon or amorphous silicon layer can be epitaxially grown on the gate dielectric layer 131 so as to completely fill the trench The doped polysilicon or amorphous silicon layer can have, for example, the second type conductivity at a relatively high conductivity level (e.g., an N+ poly or amorphous silicon gate conductor layer in the case of an NFET and a P+ poly or amorphous silicon gate conductor layer in the case of a PFET) (see FIG. 7). Alternatively, the gate conductor layer 132 could be a layer or layers of any other suitable gate conductor materials (e.g., a thin gate metal or metal alloy layer and an in situ-doped poly or amorphous silicon layer on the thin gate metal or metal alloy layer). A polishing process (e.g., a conventional chemical mechanical polishing (CMP) process) can subsequently be performed to remove any gate conductor material deposited outside the trench(es), thereby forming the trench gate structure(s) (e.g., see trench gate structure 130.2 in FIG. 8). Optionally, the gate conductor layer 132 can further be etched back (i.e., recessed) so that the top surface of the gate conductor layer 132 is, for example, at or below the level of the top surface of the semiconductor layer 101.

Figure 9:
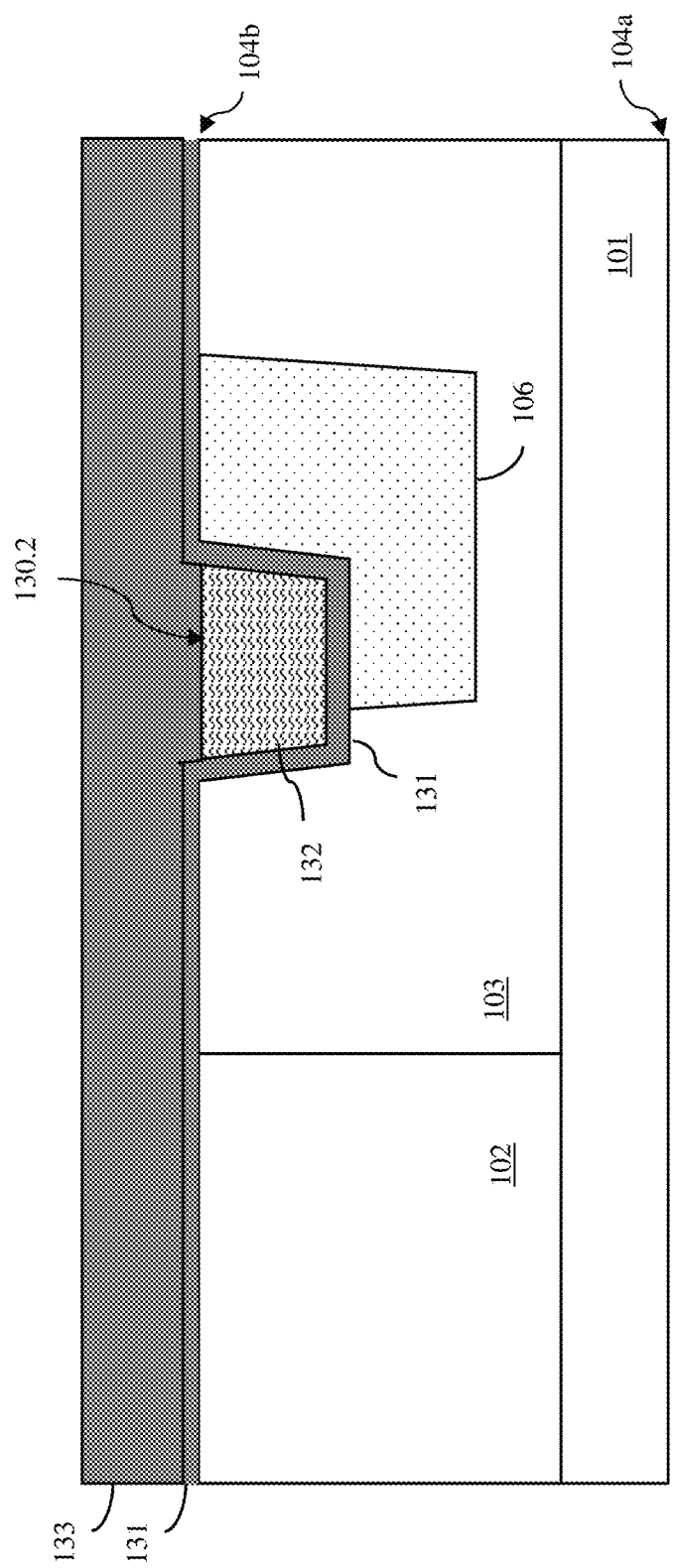

An additional gate dielectric layer 133 can then be formed (e.g., deposited) on the top surface of the gate conductor layer 132 and further onto exposed surfaces of the gate dielectric layer 131 (see process 310 and FIG. 9). The additional gate dielectric layer 133 can be the same gate dielectric material as the gate dielectric layer 131 or a different gate dielectric material. The additional gate dielectric layer 133 can be, for example, a silicon dioxide layer, a silicon oxynitride layer, a high-K gate dielectric layer or a layer or layers of any other suitable gate dielectric material(s) given the type of gate structure.

Figure 10A:
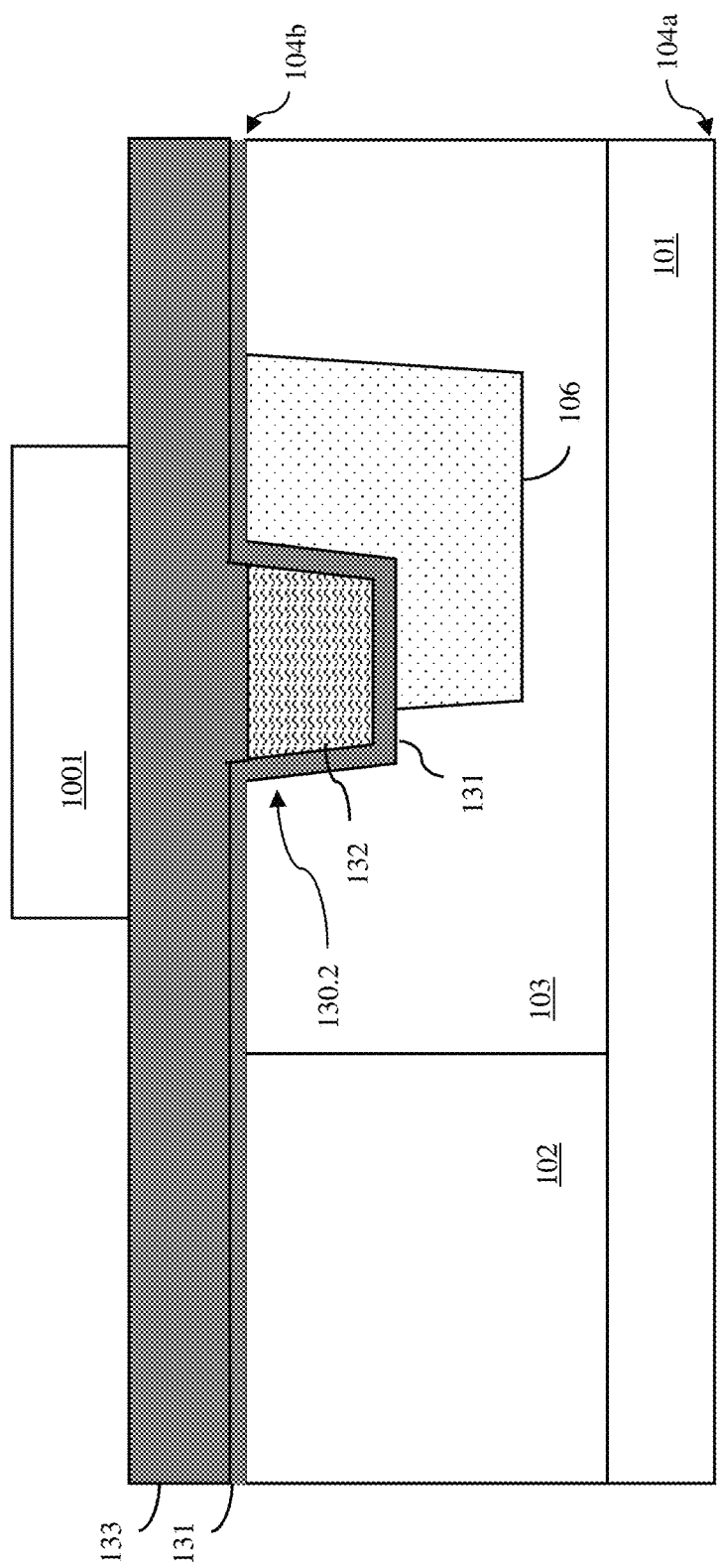
FIGS. 10A and 10B are cross-section diagrams illustrating alternative partially completed semiconductor structures formed according to the flow diagram of FIG. 3.
Figure 10B:
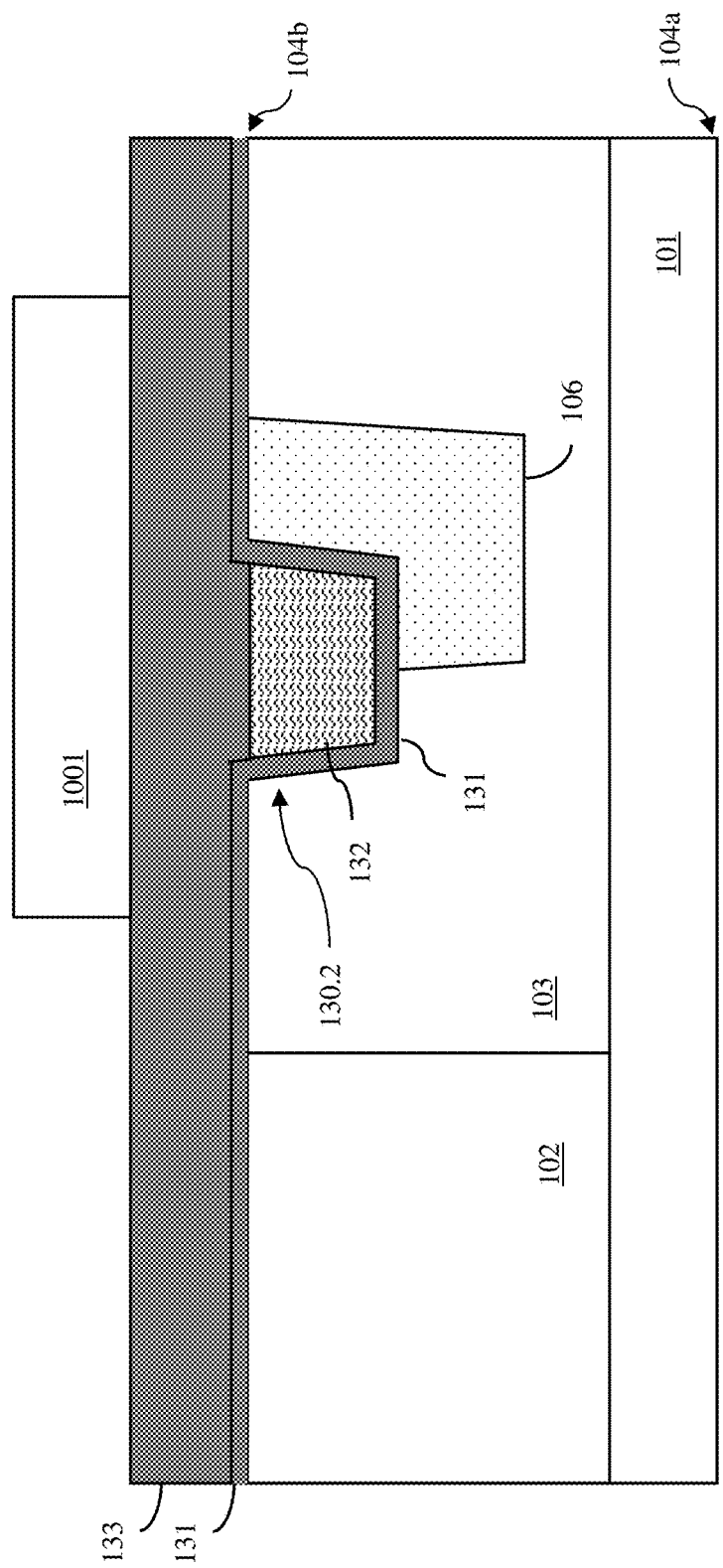
Figure 11A:
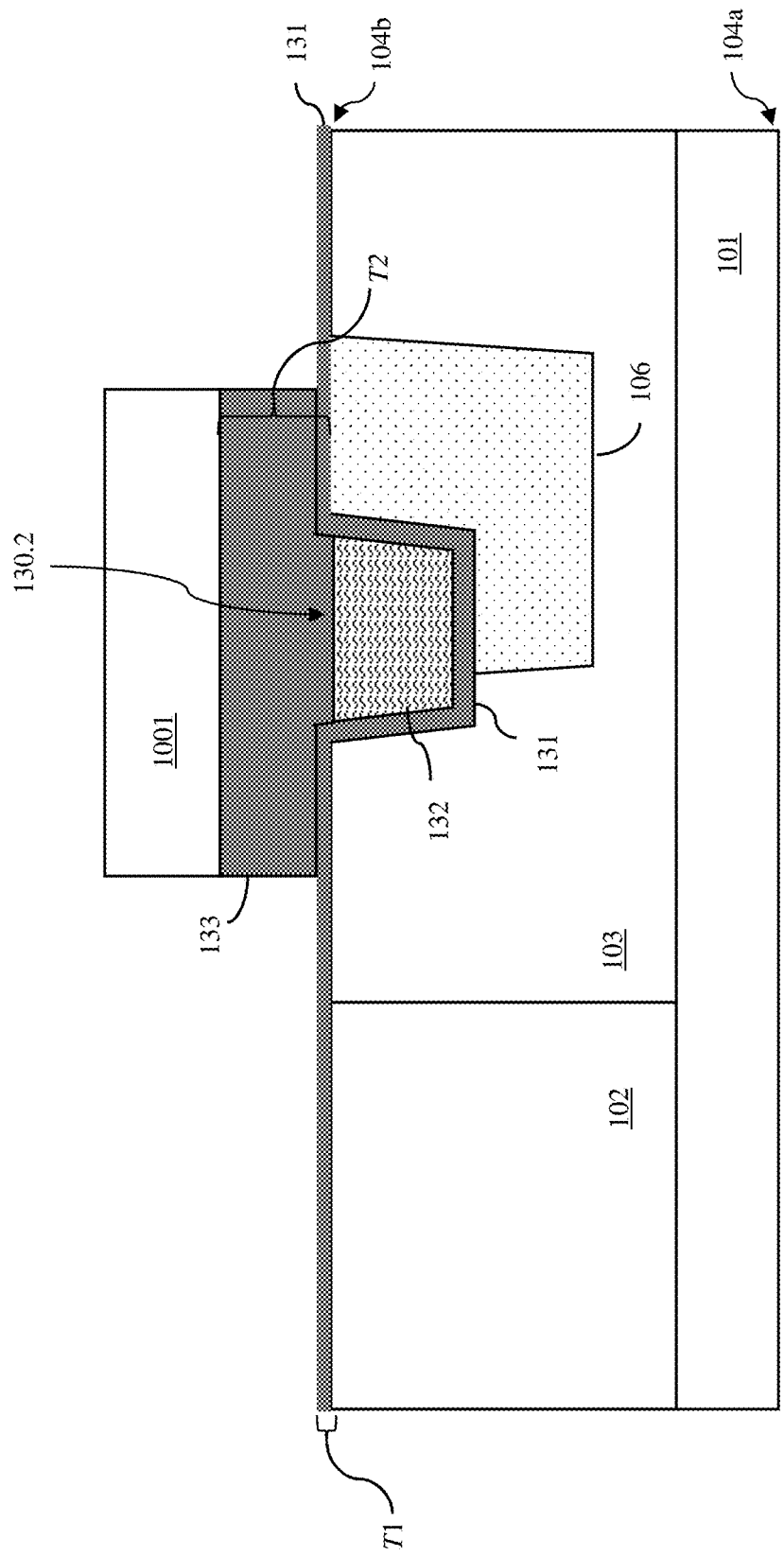

In some embodiments, a mask layer 1001 can be formed on the top surface of the additional gate dielectric layer 133. This mask layer 1001 can be patterned (e.g., using conventional lithographically patterning and etch processes) so that a remaining section of the mask layer 1001 is aligned above the trench gate structure(s) and extends partially over the internal STI region 106 (e.g., as shown in FIG. 10A) or extends completely over the internal STI region 106 and further over the semiconductor layer 101 on the opposite side of the internal STI region 106 (e.g., as shown in FIG. 10B). The length of this remaining section of the mask layer 1001 will subsequently determine placement of the drain region and particularly separation distance between the internal STI region 106 and the drain region at process 316. For purposes of illustration, the remaining processes are described below and illustrated in the figures with respect to the partially completed structure shown in FIG. 10A. A selective anisotropic etch process can subsequently be performed to recess exposed portions of the additional gate dielectric layer 133 not protected by the mask layer 1001. This etch process can stop at the gate dielectric layer 131 (as shown in FIG. 11A) or before the gate dielectric layer (as shown in FIG. 11B). In any case, the resulting partially completed structure will have a stepped gate dielectric layer including a thin gate dielectric section (T1), which is on the top surface of the semiconductor layer 101 and which extends laterally from the source region 111 over the first well 102 and further over the body-drain drift junction 115, and a thick gate dielectric section (T2), which is on the top surface of the semiconductor layer 101 above the second well 103 and which extends laterally from the thin gate dielectric section (T1) over the trench gate structure(s) and onto the internal STI region 106. The thin gate dielectric section (T1) may only include a portion of the gate dielectric layer 131 (as illustrated as illustrated in FIG. 11A) or may include a portion of the gate dielectric layer 131 and a thinned portion of the additional gate dielectric layer 133 thereon (as illustrated in FIG. 11B).

In other embodiments, the additional gate dielectric layer 133 can be polished (e.g., using a conventional CMP process) so that the resulting partially completed structure has a planar gate dielectric layer. In this case, the top surface of the gate conductor layer 132 can be covered by the additional gate dielectric layer 133 and either the top surface of the gate dielectric layer 131 will be exposed and co-planar with the top surface of the additional gate dielectric layer 133 or the additional gate dielectric layer 133 will cover the gate dielectric layer 133 as well as the gate conductor layer 132.

For purposes of illustration, the remaining process steps are described below and illustrated in the figures with respect to the partially completed structure shown in FIG. 11A. Following formation and processing of the additional gate dielectric layer 133, as described above, conventional planar EDMOSFET processing can be performed to complete the EDMOSFET structure.

Figure 12:
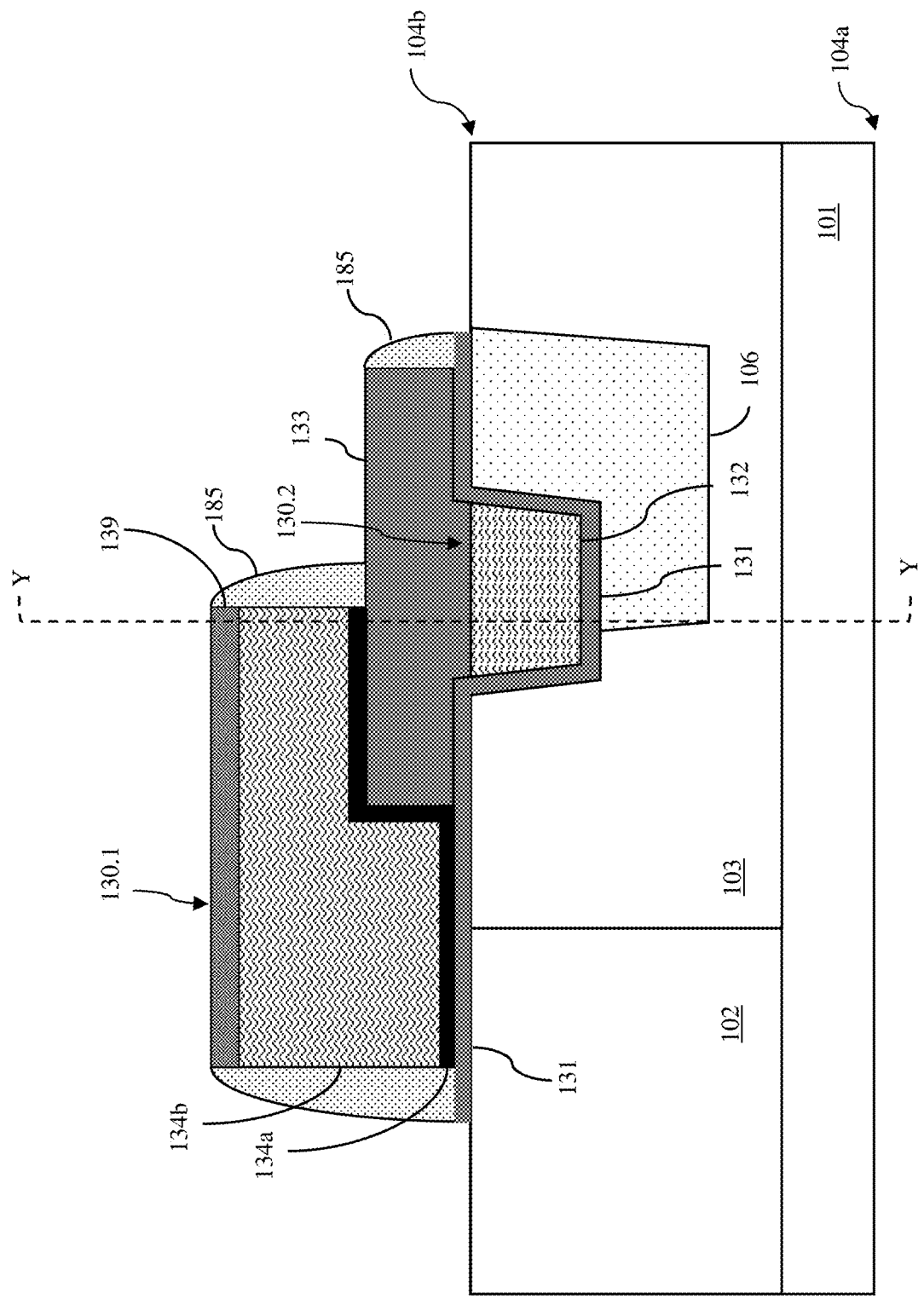
FIGS. 12(1)-12(2) are different cross-section diagrams illustrating a partially completed semiconductor structure formed according to the flow diagram of FIG. 3.
Figure 12:
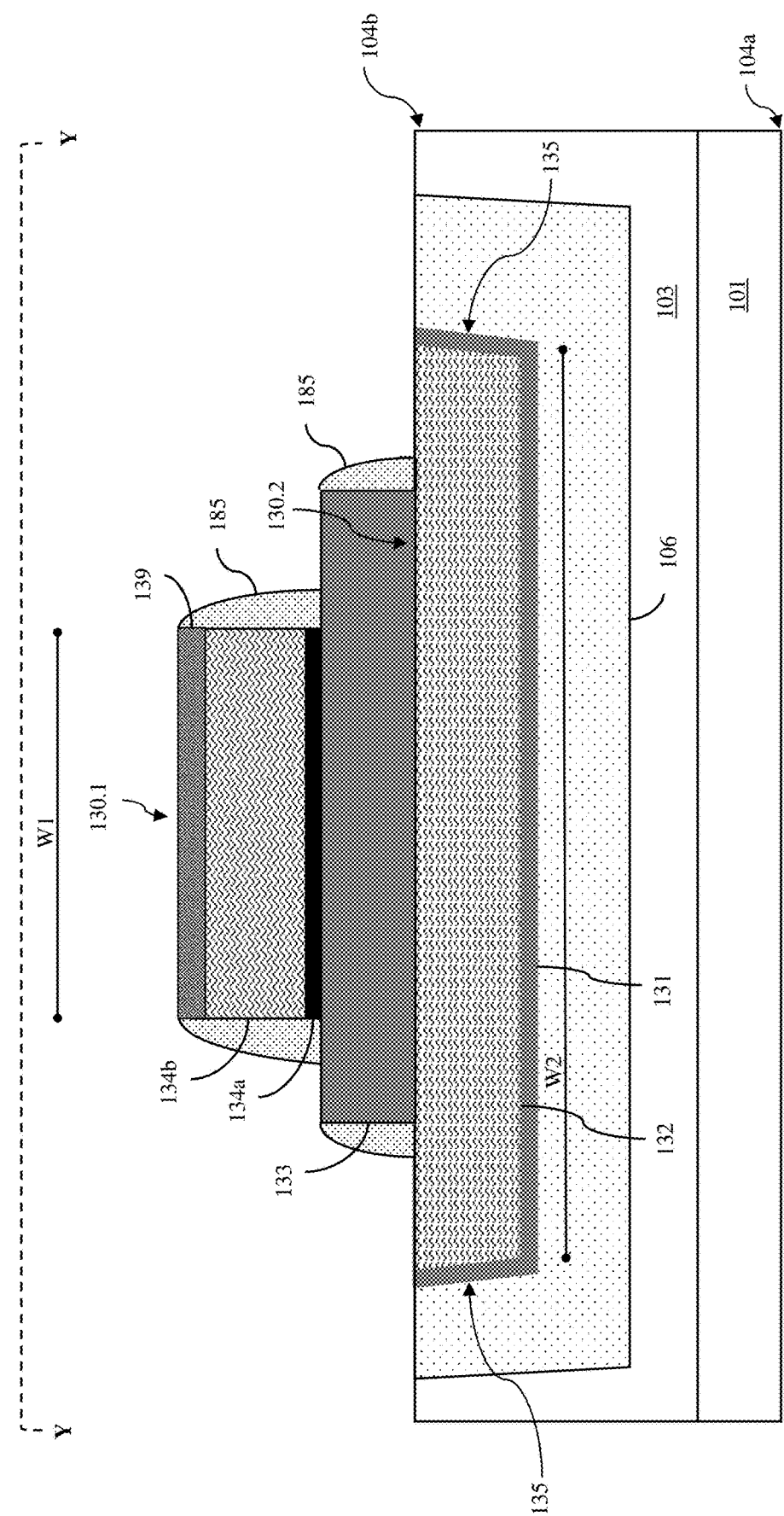

For example, a gate structure can be formed (see process 312 and FIGS. 12(1) and 12(2)). The gate structure formed at process 312 can be a gate-first gate structure (e.g., a gate-first polysilicon gate structure or a gate-first high-k metal gate structure), which will function as the primary gate structure 130.1 of the EDMOSFET. Alternatively, the gate structure formed at process 312 can be a sacrificial gate structure (which can subsequently be replaced with a replacement metal gate (RMG) structure). Techniques for forming gate-first gate structures and sacrificial gate structures are well known in the art and, thus, the details thereof have been omitted form this specification in order to allow the reader to focus on the salient aspects of the disclosed methods. However, for purposes of illustration, FIGS. 12(1)

and 12(2) show a gate-first high-k metal gate structure having been formed at process 312. In this case, multiple layers have been deposited over the partially completed structure shown in FIG. 11A. These layers include, for example, a thin metallic layer 134a (e.g., a work function metal or metal alloy layer), a polysilicon layer 134b on the metallic layer 134a, and a dielectric gate cap layer 139 (e.g., a silicon nitride layer) on the polysilicon layer 134b. These layers can be patterned (e.g., using conventional lithographic patterning and etch processes) to form a gate stack on the thin gate dielectric section (T1) (i.e., above the above the first well 102, the body-drain drift junction 115, on a portion of the second well 103) and further on an adjacent portion of the thick gate dielectric section (T2) (i.e., above a portion of the second well 103). As illustrated, the gate stack can be formed such that one end of the thick gate dielectric section (T2) extends laterally beyond the gate stack, as shown in FIG. 12(1). Optionally, the gate stack can be formed so that it extends over one or more of the trench gate structure(s), also as shown in FIGS. 12(1)-12(2). Furthermore, the gate stack can be formed so as to be narrower in width than the trench gate structure 130.2 (and if applicable the trench gate structure 130.3) so that the ends 135 of the trench gate structure(s) are exposed, as shown in FIG. 12(2) (i.e., a first width (W1) of the gate stack is less than a second width (W2) of each previously formed trench gate structure).

Also as illustrated in FIGS. 12(1)-12(2), gate sidewall spacers 185 can be formed on the sidewalls of the gate stack, including on sidewalls of the thick gate dielectric section (T2), using conventional gate sidewall spacer formation techniques (see process 314). For example, a dielectric gate sidewall spacer material layer can be conformally deposited over the partially completed structure. Then, a selective anisotropic etch process can be performed in order remove horizontal portions of the dielectric gate sidewall spacer material layer. Such a selective anisotropic etch process will leave intact, as gate sidewall spacers 185, vertical portions of the dielectric gate sidewall spacer material layer covering any vertical surfaces and, particularly, covering the sidewalls of the gate stack, including the sidewalls of the thick gate dielectric section (T2), as illustrated. The dielectric gate sidewall spacer material layer (and thereby the gate sidewall spacers 185) can be made, for example, of silicon dioxide, silicon nitride, silicon carbon nitride, silicon boron carbon nitride or any other suitable gate sidewall spacer material. It should be noted that the gate sidewall spacer material can be different from one or more of the gate dielectric materials (e.g., from the gate dielectric material of the additional gate dielectric layer 133 and, optionally, from the gate dielectric material of the gate dielectric layer 131) so as to allow for selective etching of the gate sidewall spacer material without etching the gate dielectric material(s) and vice versa, as necessary during processing. Additionally, if the gate structure formed at process 312 is a sacrificial gate structure, then the dielectric gate sidewall spacer material should be selected to allow for selective removal of the sacrificial gate structure at process 322, discussed below, without significantly impacting the gate sidewall spacers so that a RMG can subsequently be formed in a gate opening defined by the gate sidewall spacers.

Also as illustrated in FIGS. 12(1)-12(2), designated source/drain areas in the first and second wells 102-103 of the semiconductor layer 101 can be exposed (e.g., as a result of the anisotropic etch process used to form the gate sidewall spacers if the gate dielectric layer 131 and the gate sidewall spacers 185 are made of the same material or as a result of a discrete etch process to remove exposed portions of the gate dielectric layer 131 following gate sidewall spacer formation). The designated source area will be in the first well aligned with the outer edge of the gate sidewall spacer on the gate stack. The designated drain area will be in the second well somewhere between immediately adjacent to one side of the internal STI region 106 (e.g., if the gate sidewall spacer on the thick gate dielectric section (T2) is above the internal STI region 106) and aligned with the outer edge of the gate sidewall spacer on the thick gate dielectric section (T2) (e.g., if the thick gate dielectric section (T2) extends laterally beyond the internal STI region 106). Those skilled in the art will recognize that, depending upon the gate dielectric material used for the additional gate dielectric layer 133, the etch process(es) used during or after gate sidewall spacer formation may also result in some etching back of exposed surfaces of the additional gate dielectric layer 133 (not shown). Thus, process specifications should be selected so as to avoid etching through the additional gate dielectric layer 133 and exposing the gate conductor layer 132.

Figure 13:
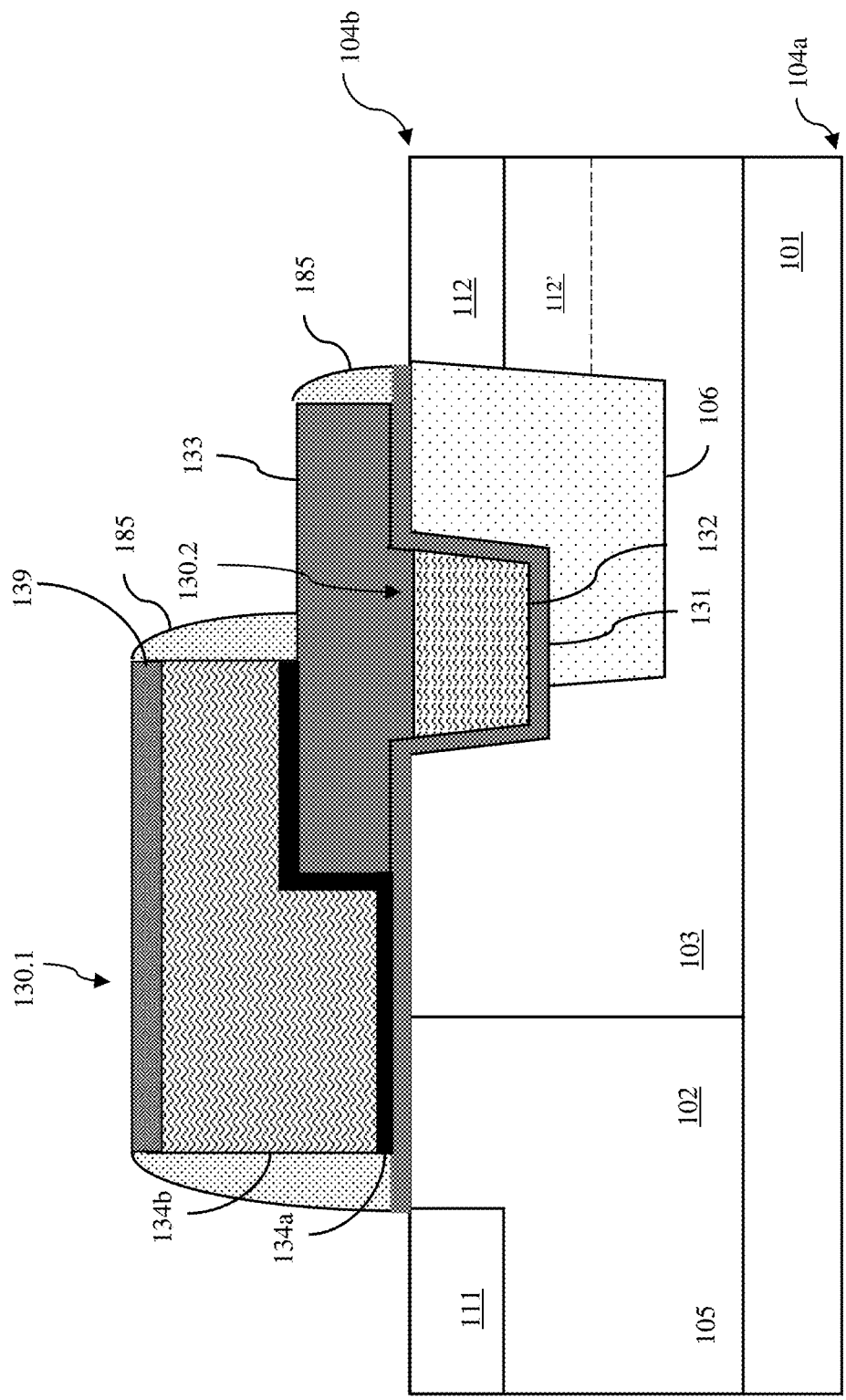
FIG. 13 is a cross-section diagram illustrating a partially completed semiconductor structure formed according to the flow diagram of FIG. 3.

Source and drain regions 111-112 can be formed in the exposed source/drain areas in the first and second wells 102-103, respectively (see process 316 and FIG. 13). The source and drain regions 111-112 can be formed so as to have a second type conductivity at a relatively high level (e.g., the source region 111 can be an N+ source region in the case of an NFET or a P+ source region in the case of a PFET). In some embodiments, the source and drain regions 111-112 can be formed at process 316 using shallow dopant implantation process(es). In other embodiments, the source and drain regions 111-112 can be formed at process 316 by etching source/drain trenches and filling or over filling the source/drain trenches with in situ doped epitaxial semiconductor material. In some embodiments, the source and drain regions 111-112 can be concurrently formed at process 316 such that they extend the same depth (D1) into the semiconductor layer 101. In other embodiments, the source and drain regions can be formed using discrete process steps performed so that the drain region extends deeper into the semiconductor layer 101 than the source region (as indicated by item number 112' and the dashed line in the figures). That is, the discrete process steps can be performed so that the source region 111 extends a first depth (D1) into the semiconductor layer 101, so that the drain region 112' extends a second depth (D2) into the semiconductor layer 101, and so that the second depth (D2) is greater than the first depth (D1). Increasing the depth of the drain region relative to the depth of the source region can be employed to increase both the linear drain current (IDlin) and the saturation drain current (IDsat).

Figure 14:
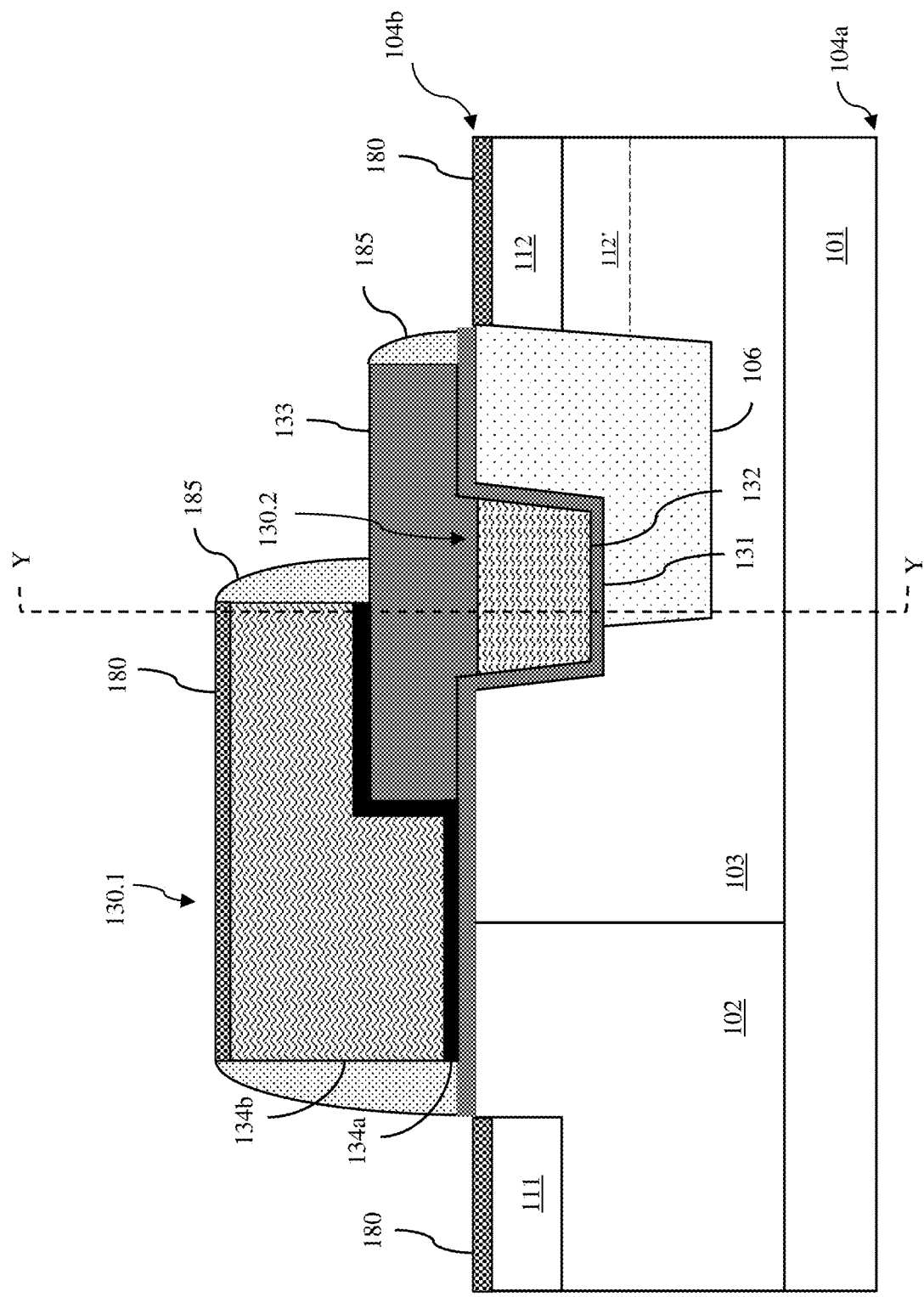
FIGS. 14(1)-14(2) are different cross-section diagrams illustrating a partially completed semiconductor structure formed according to the flow diagram of FIG. 3.
Figure 14:
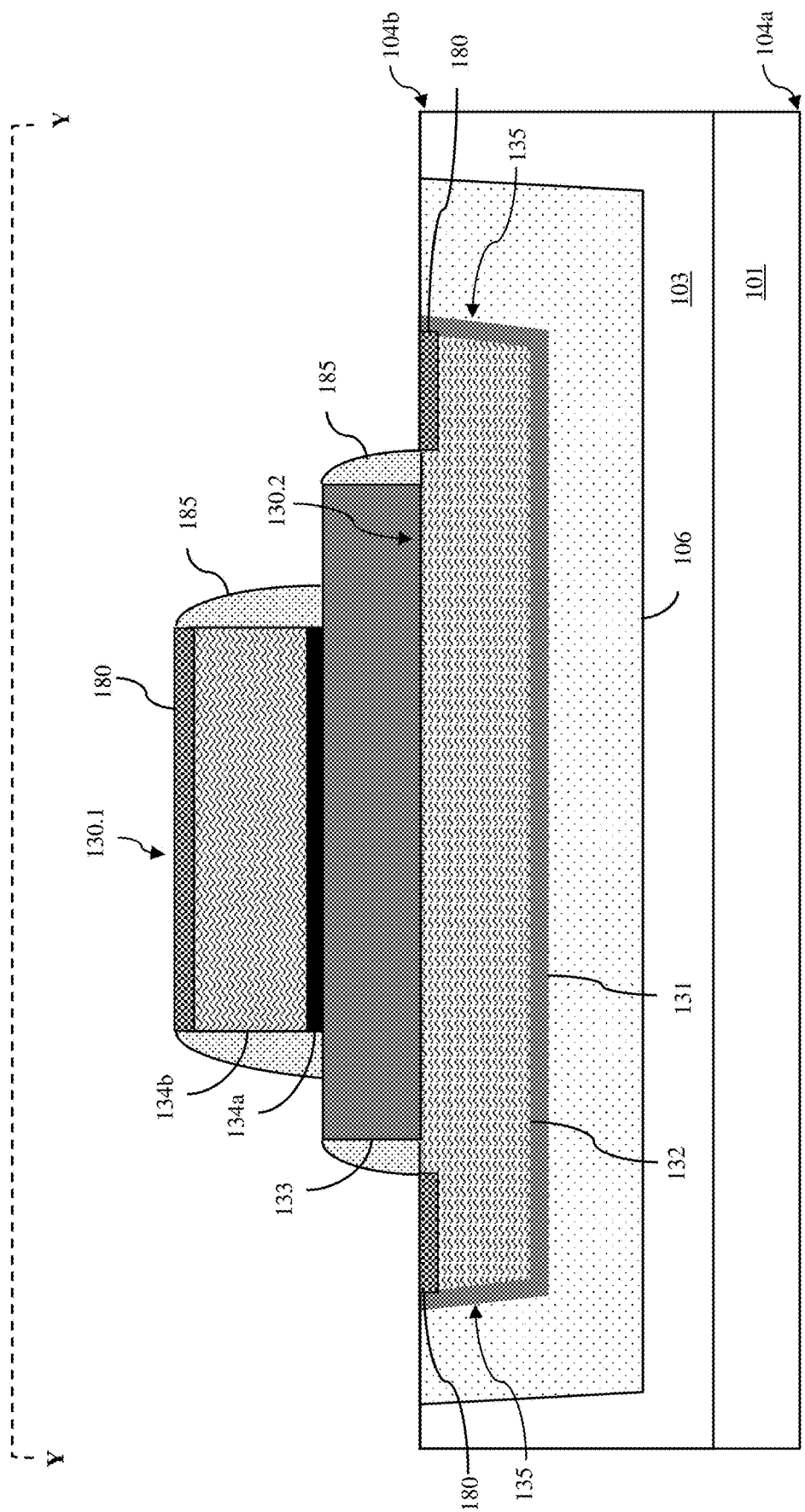

Following source and drain region formation at process 316, metal silicide layers 180 can be formed on exposed silicon surfaces using a conventional self-aligned silicide process (see process 318 and FIGS. 14(1) and 14(2)). The exposed silicon surfaces on which the metal silicide layers 180 are formed can include, for example, the source region 111, the drain region 112, and the exposed ends 135 of the polysilicon or amorphous silicon gate conductor layer 132 of the trench gate structure(s). It should be noted that if the gate structure formed at process 316 is a gate-first gate structure (e.g., with a dielectric gate cap layer 139 on a polysilicon layer 134b), the dielectric gate cap layer 139 can also be selectively removed so that a silicide layer 180 can also be formed thereon. The metal silicide layers 180 can be, for example, layers of cobalt silicide (CoSi), nickel silicide (NiSi), tungsten silicide (WSi), titanium silicide (TiSi), or any other suitable metal silicide material.

Additional processing can then be performed in order to complete the semiconductor structure 100A of FIGS. 1A(1)-1A(2) (or, alternatively, the semiconductor structure 100B of FIGS. 1B(1)-1B(2) or 100C of FIGS. 1C(1)-1C(3)). The additional processing can include formation of one or more dielectric layers over the partially completed structure (see process 320). For example, a thin conformal contact etch stop layer (CESL) 161 can be deposited over the source region, gate structure, and drain region. This thin CESL 161 can be, for example, a thin silicon nitride layer. Furthermore, a blanket interlayer dielectric (ILD) material layer 162 can be formed on the CESL layer 161. Optionally, the CESL 161 can be deposited so as to be either a tensilely strained layer or a compressively strained layer. Those skilled in the art will recognize that strained layers are often formed over FETs to improve charge carrier mobility. For example, a tensilely strained CESL will improve electron mobility of an NFET and a compressively strained CESL will improve hole mobility in a PFET. Techniques for forming such strained layers are well known in the art and, thus, the details thereof have been omitted from the application in order to allow the reader to focus on the salient aspects of the disclosed embodiments. The ILD material layer 162 can be, for example, a silicon dioxide layer, a doped silicon glass layer (e.g., a phosphosilicate glass (PSG) layer or a borophosphosilicate glass (BPSG) layer), or any other suitable ILD material layer. It should be noted that, if a sacrificial gate structure was formed at process 316, then following ILD material layer deposition replacement metal gate (RMG) processing can be performed (see process 322). For example, a CMP process could be performed so as to expose the sacrificial gate structure. Then, the sacrificial gate structure can be selectively removed to form a gate opening. A replacement metal gate (RMG) structure, which will function as the primary gate structure 130.1, can be formed within the gate opening and middle of the line (MOL) dielectric layer(s) can be formed over the RMG structure and the ILD material layer.

The additional processing can also include the formation of contacts 191-195 extending through the various dielectric layers to the source region 111, the drain region 112, the end(s) 135 of the trench gate structure 130.2 (and if applicable the trench gate structure 130.3), and the primary gate structure 130.1 (i.e., the gate-first gate structure or, if applicable, the RMG structure) (see process 324). Through such contacts, the primary gate structure 130.1 and the trench gate structure 130.2 (and if applicable the trench gate structure 130.3) can be electrically biased. Thus, the trench gate structure(s) (which is/are separated from the drain region by the internal STI region 106) can be employed to increase both linear drain current (IDlin) and saturation drain current (IDsat). As mentioned above with regard to the structure embodiments, the trench gate structure 130.2 (and if applicable the trench gate structure 130.3) can be tied to the same voltage source as the primary gate structure 130.1 for increased drive current. Alternatively, the trench gate structure 130.2 (and if applicable the trench gate structure 130.3) could be tied to different voltage source(s) than the primary gate structure 130.1 for independent biasing (e.g., to selectively adjust the drive current).

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a semiconductor layer; and
   a transistor comprising:
      a first well in the semiconductor layer and having a first type conductivity;
      a second well in the semiconductor layer positioned laterally adjacent to the first well and having a second type conductivity that is different from the first type conductivity;
      a trench gate structure in the second well and physically separated from a junction between the first well and the second well; and
      a primary gate structure on the semiconductor layer traversing the junction,
      wherein gate conductor materials of the trench gate structure and the primary gate structure are physically separated by a gate dielectric material.

2. The semiconductor structure of claim 1, wherein the trench gate structure is wider than the primary gate structure and independently biasable.

3. The semiconductor structure of claim 1, wherein the transistor further comprises:
   a source region having the second type conductivity in the first well and physically separated from the junction;
   an isolation region in the second well, wherein the trench gate structure is positioned laterally between the junction and the isolation region; and
   a drain region having the second type conductivity in the second well, wherein the isolation region is positioned laterally between the drain region and the trench gate structure.

4. The semiconductor structure of claim 3,
   wherein the semiconductor layer has a first surface and a second surface opposite the first surface,
   wherein the source region extends a first depth into the first well from the second surface, and
   wherein the drain region extends a second depth into the second well from the second surface, and
   wherein the second depth is greater than the first depth.

5. The semiconductor structure of claim 3, wherein the trench gate structure abuts the isolation region.

6. The semiconductor structure of claim 3, wherein the drain region abuts the isolation region opposite the trench gate structure.

7. The semiconductor structure of claim 3, wherein the drain region is physically separated from the isolation region.

8. The semiconductor structure of claim 3, wherein the trench gate structure is within a trench with a first side extending into the semiconductor layer and a second side extending into the isolation region.

9. The semiconductor structure of claim 3,
   wherein the trench gate structure comprises:
      a gate dielectric layer lining the trench; and
      a gate conductor layer on the gate dielectric layer, and
   wherein the gate dielectric layer has either an essentially uniform thickness within the trench or different thicknesses on a bottom and sidewalls of the trench.

10. The semiconductor structure of claim 9,
    wherein the semiconductor layer has a first surface and a second surface opposite the first surface,
    wherein the primary gate structure comprises: a thin gate dielectric section on the second surface above the first well and extending laterally over the junction and a thick gate dielectric section on the second surface above the second well, extending laterally from the thin gate dielectric section over the trench gate structure and onto the isolation region,
    wherein the primary gate structure further comprises an additional gate conductor layer on the thin gate dielectric section and the thick gate dielectric section, and
    wherein the thick gate dielectric section extends laterally beyond a sidewall of the additional gate conductor layer.

11. The semiconductor structure of claim 10,
    wherein the gate dielectric layer has a portion on the second surface of the semiconductor layer adjacent to the trench,
    wherein the thin gate dielectric section comprises at least the portion of the gate dielectric layer on the second surface of the semiconductor layer adjacent to the trench, and
    wherein the thick gate dielectric section comprises at least an additional gate dielectric layer on the gate conductor layer within the trench.

12. The semiconductor structure of claim 10, wherein the thick gate dielectric section further extends laterally completely over the isolation region and onto the second surface of the semiconductor layer beyond the isolation region.

13. The semiconductor structure of claim 10, wherein the gate conductor layer of the trench gate structure and the additional gate conductor layer of the primary gate structure comprise different gate conductor materials.

14. A semiconductor structure comprising:
a semiconductor layer; and
a transistor comprising:
  a first well in the semiconductor layer and having a first type conductivity;
  a second well in the semiconductor layer positioned laterally adjacent to the first well and having a second type conductivity that is different from the first type conductivity;
  multiple trench gate structures comprising:
    a first trench gate structure in the second well abutting an isolation region; and
    a second trench gate structure in the second well positioned laterally between and physically separated from the first trench gate structure and a junction between the first well and the second well; and
    a primary gate structure on the semiconductor layer traversing the junction,
  wherein gate conductor materials of the multiple trench gate structures and the primary gate structure are physically separated by a gate dielectric material.

15. A method comprising:
forming an isolation region in a semiconductor layer; and
forming a transistor comprising:
  a first well in the semiconductor layer and having a first type conductivity;
  a second well in the semiconductor layer positioned laterally adjacent to the first well and having a second type conductivity that is different from the first type conductivity, wherein the isolation region is within the second well and physically separated from a junction between the first well and the second well;
  a trench gate structure in the second well positioned laterally between the isolation region and the junction and further physically separated from the junction; and
  a primary gate structure on the semiconductor layer traversing the junction,
  wherein gate conductor materials of the trench gate structure and the primary gate structure are physically separated by gate dielectric material.

16. The method of claim 15, wherein the semiconductor layer has a first surface and a second surface opposite the first surface and wherein the forming of the transistor comprises:
  forming the first well and the second well positioned laterally immediately adjacent to the first well such that the isolation region is within the second well and physically separated from the junction;
  forming a trench for the trench gate structure positioned laterally between the isolation region and the junction; and
  forming the trench gate structure in the trench, wherein the forming of the trench gate structure comprises:
    forming a gate dielectric layer so as to line the trench, wherein the gate dielectric layer can be formed so as to have an essentially uniform thickness within the trench or different thicknesses on a bottom and sidewalls of the trench; and
    forming a gate conductor layer on the gate dielectric layer so as to fill the trench.

17. The method of claim 16, wherein the forming of the primary gate structure comprises:
  forming an additional gate dielectric layer on a portion of the gate dielectric layer above the semiconductor layer and further over the gate conductor layer;
  patterning the additional gate dielectric layer to form:
    a thin gate dielectric section on the second surface above the first well and extending laterally over the junction; and
    a thick gate dielectric section on the second surface above the second well and extending laterally from the thin gate dielectric section over the trench gate structure and onto the isolation region; and
  performing any of gate-first gate processing and replacement metal gate processing.

18. The method of claim 17, further comprising:
  forming a source region with the second type conductivity in the first well and physically separated from the junction; and
  forming a drain region with the second type conductivity in the second well such that the isolation region is positioned laterally between the drain region and the trench gate structure.

19. The method of claim 18, wherein the forming of the source region and the forming of the drain region are performed so that the source region and the drain region either extend a same depth or different depths into the semiconductor layer from the second surface.

20. The method of claim 18, wherein the forming of the drain region is performed so that the drain region either abuts or is physically separated from the isolation region.

* * * * *